United States Patent
Choi

(10) Patent No.: US 11,636,900 B2
(45) Date of Patent: Apr. 25, 2023

(54) SEMICONDUCTOR MEMORY DEVICE AND METHOD OF OPERATING THE SAME

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 78 days.

(21) Appl. No.: 17/344,005

(22) Filed: Jun. 10, 2021

(65) Prior Publication Data
US 2022/0180941 A1 Jun. 9, 2022

(30) Foreign Application Priority Data
Dec. 4, 2020 (KR) .................. 10-2020-0168782

(51) Int. Cl.
| | | |
|---|---|---|
| G11C 16/04 | (2006.01) | |
| G11C 16/26 | (2006.01) | |
| G11C 16/34 | (2006.01) | |
| G11C 16/08 | (2006.01) | |
| G11C 16/24 | (2006.01) | |

(52) U.S. Cl.
CPC .......... G11C 16/26 (2013.01); G11C 16/0483 (2013.01); G11C 16/08 (2013.01); G11C 16/24 (2013.01); G11C 16/3459 (2013.01)

(58) Field of Classification Search
CPC ..... G11C 16/26; G11C 16/0483; G11C 16/08; G11C 16/24; G11C 16/3459
See application file for complete search history.

(56) References Cited

U.S. PATENT DOCUMENTS

| | | | |
|---|---|---|---|
| 7,898,872 B2 * | 3/2011 | Han | G11C 16/3454 365/185.25 |
| 11,037,639 B2 * | 6/2021 | Her | G11C 16/3422 |
| 2012/0008419 A1 * | 1/2012 | Ha | G11C 16/06 365/185.25 |

FOREIGN PATENT DOCUMENTS

| | | |
|---|---|---|
| KR | 10-2011-0132767 A | 12/2011 |
| KR | 10-2020-0050762 A | 5/2020 |

* cited by examiner

*Primary Examiner* — Pho M Luu
(74) *Attorney, Agent, or Firm* — IP & T Group LLP

(57) ABSTRACT

A semiconductor memory device includes a memory block, and control logic. The memory block includes a plurality of memory cells. The control logic controls a peripheral circuit to perform a read operation on selected memory cells among the plurality of memory cells. The read operation includes a bit line precharge operation, an evaluation operation, and a sensing operation. The control logic is configured to control the peripheral circuit to float a common source line coupled to the memory block during at least a partial period of a period of the bit line precharge operation, in which a voltage of a plurality of bit lines coupled to the memory block increases.

21 Claims, 20 Drawing Sheets

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0168782, filed on Dec. 4, 2020, with the Korean Intellectual Property Office, and which is incorporated herein by reference in its entirety.

BACKGROUND

Field of Invention

One or more embodiments described herein relate to a semiconductor memory device and a method of operating a semiconductor memory device.

Description of Related Art

A semiconductor memory device may be formed to have a two-dimensional structure or a three-dimensional structure. When formed in a two-dimensional structure, strings are arranged horizontally on a semiconductor substrate. When formed in a three-dimensional structure, strings are vertically stacked on a semiconductor substrate. A three-dimensional memory device provides a greater degree of integration relative to two-dimensional memory devices and therefore has been of interest.

SUMMARY

One or more embodiments described herein provide a semiconductor memory device capable of reducing power consumption during a read operation or a verify operation.

One or more embodiments described herein provide a method of operating such a semiconductor memory device.

According to an embodiment of the present disclosure, a semiconductor memory device includes a memory block, and a control logic. The memory block includes a plurality of memory cells. The control logic controls a peripheral circuit to perform a read operation on selected memory cells among the plurality of memory cells. The read operation includes a bit line precharge operation, an evaluation operation, and a sensing operation. The control logic is configured to control the peripheral circuit to float a common source line coupled to the memory block during at least a partial period of a period of the bit line precharge operation.

In an embodiment, in the bit line precharge operation, the control logic may be configured to control the peripheral circuit to increase the voltage of the plurality of bit lines to a predetermined precharge voltage, and apply a turn-off voltage to a drain select line and a source select line coupled to the memory block.

In an embodiment, in the evaluation operation, the control logic may be configured to control the peripheral circuit to apply a read voltage to a selected word line coupled to the selected memory cells, apply a pass voltage to an unselected word line, and apply a turn-on voltage to a drain select line and a source select line coupled to the memory block.

In an embodiment, the control logic may be configured to control the peripheral circuit to apply a reference voltage to the common source line in the evaluation operation.

In an embodiment, in the sensing operation, the control logic may be configured to control the peripheral circuit to temporarily store information indicating whether the selected memory cells are turned on.

In an embodiment, the control logic may be configured to control the peripheral circuit to float the common source line during at least a partial period of the sensing operation.

According to another embodiment of the present disclosure, a semiconductor memory device includes a memory block, and a control logic. The memory block includes a plurality of memory cells. The control logic controls a peripheral circuit to perform a plurality of read operations on selected memory cells among the plurality of memory cells. Each of the plurality of read operations includes a bit line precharge operation, an evaluation operation, and a sensing operation. The control logic is configured to control the peripheral circuit to float a common source line coupled to the memory block during at least a partial period of a period which includes the sensing operation of a first read operation and the bit line precharge operation of a second read operation following the first read operation.

In an embodiment, in the sensing operation of the first read operation, the control logic may be configured to control the peripheral circuit to temporarily store information indicating whether memory cells selected as a target of the first read operation are turned on.

In an embodiment, in the bit line precharge operation of the second read operation, the control logic may be configured to control the peripheral circuit to increase a voltage of the plurality of bit lines to a predetermined precharge voltage, and apply a turn-off voltage to a drain select line and a source select line coupled to the memory block.

In an embodiment, in the evaluation operation of the first read operation, the control logic may be configured to control the peripheral circuit to apply a read voltage to a first selected word line coupled to first memory cells selected as a target of the first read operation, apply a pass voltage to an unselected word line other than the first selected word line, apply a turn-on voltage to a drain select line and a source select line coupled to the memory block, and apply a reference voltage to the common source line.

In an embodiment, in the evaluation operation of the second read operation, the control logic may be configured to control the peripheral circuit to apply the read voltage to a second selected word line coupled to second memory cells selected as a target of the second read operation, apply the pass voltage to an unselected word line other than the second selected word line, apply the turn-on voltage to the drain select line and the source select line coupled to the memory block, and apply the reference voltage to the common source line.

According to still another embodiment of the present disclosure, a method of operating a semiconductor memory device includes performing a read operation on selected memory cells among a plurality of memory cells. The read operation includes precharging a voltage of bit lines coupled to a memory block including the selected memory cells, applying a read voltage to a selected word line coupled to the selected memory cells among word lines coupled to the memory block, and applying a read pass voltage to an unselected word line other than the selected word line among the word lines, and temporarily storing information indicating whether the selected memory cells are turned on, based on the voltages of each of the bit lines. Precharging the voltage of the bit lines coupled to the memory block including the selected memory cells includes floating a common source line coupled to the memory block during at least a partial period of a period in which the voltage of the bit lines increases.

In an embodiment, precharging the voltage of the bit lines coupled to the memory block including the selected memory cells may include increasing the voltage of the plurality of bit lines to a predetermined precharge voltage and applying a turn-off voltage to a drain select line and a source select line coupled to the memory block.

In an embodiment, applying the read voltage to the selected word line coupled to the selected memory cells among the word lines coupled to the memory block and applying the read pass voltage to the unselected word line other than the selected word line among the word lines may include applying a read voltage to a selected word line coupled to the selected memory cells, applying a pass voltage to an unselected word line, and applying a turn-on voltage to a drain select line and a source select line coupled to the memory block.

In an embodiment, applying the read voltage to the selected word line coupled to the selected memory cells among the word lines coupled to the memory block, and applying the read pass voltage to the unselected word line other than the selected word line among the word lines may include applying a reference voltage to the common source line.

In an embodiment, temporarily storing information indicating whether the selected memory cells are turned on, based on the voltages of each of the bit lines may include floating the common source line.

According to still another embodiment of the present disclosure, a semiconductor memory device includes a memory block, a peripheral circuit, and a control logic. The memory block includes a plurality of memory cells. The peripheral circuit performs a program operation on selected memory cells among the plurality of memory cells. The control logic controls the program operation of the peripheral circuit. The program operation includes a plurality of program loops, and each of the plurality of program loops includes a program phase and a verify phase. The verify phase includes a bit line precharge operation, an evaluation operation, and a sensing operation. The control logic is configured to control the peripheral circuit to float a common source line coupled to the memory block during at least a partial period of a period of the bit line precharge operation, in which a voltage of a plurality of bit lines coupled to the memory block increases.

In an embodiment, in the bit line precharge operation, the control logic may be configured to control the peripheral circuit to increase the voltage of the plurality of bit lines to a predetermined precharge voltage, and apply a turn-off voltage to a drain select line and a source select line coupled to the memory block.

In an embodiment, in the evaluation operation, the control logic may be configured to control the peripheral circuit to apply a verify voltage to a selected word line coupled to the selected memory cells, apply a pass voltage to an unselected word line, apply a turn-on voltage to a drain select line and a source select line coupled to the memory block, and apply a reference voltage to the common source line.

In an embodiment, in the sensing operation, the control logic may be configured to control the peripheral circuit to temporarily store information indicating whether the selected memory cells are turned on, and float the common source line during at least a partial period of the sensing operation.

According to still another embodiment of the present disclosure, an apparatus includes a storage area and at least one processor. The storage area is configured to store instructions. The at least one processor is configured to execute the instructions to control a read operation including a bit line precharge operation, an evaluation operation, and a sensing operation. The at least one processor is configured to control the read operation to float a common source line coupled to a memory block during at least a partial period of a period of the bit line precharge operation, in which a voltage of a plurality of bit lines coupled to the memory block increases.

The present technology may provide a semiconductor memory device capable of reducing power consumption during a read operation or a verify operation, and a method of operating the same.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and are not limited to the embodiments described in the present specification or application.

Figure 1:
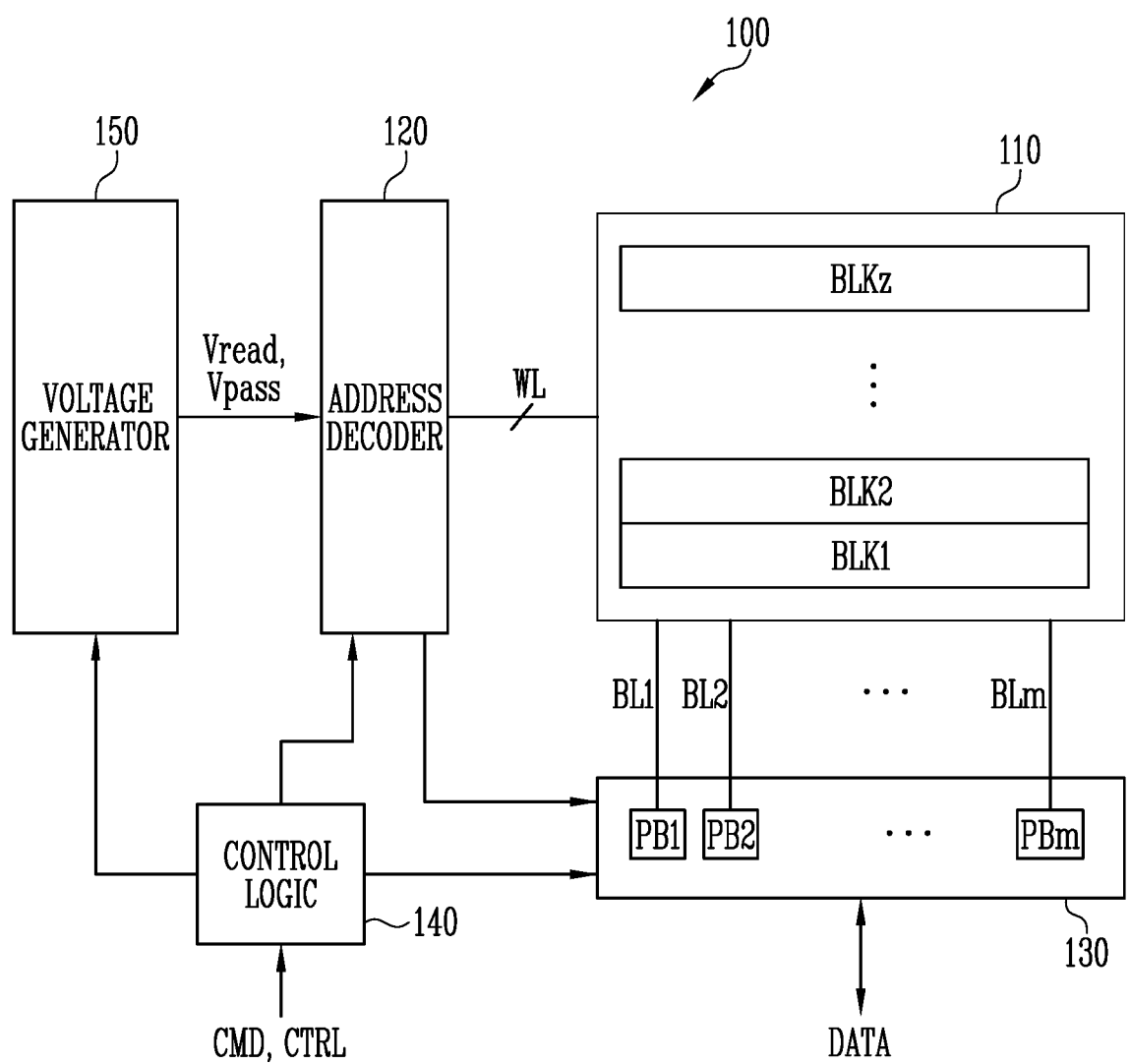
FIG. 1 illustrates an embodiment of a semiconductor memory device.

FIG. 1 is a block diagram illustrating a semiconductor memory device 100 according to an embodiment.

Referring to FIG. 1, the semiconductor memory device 100 includes a memory cell array 110, an address decoder 120, a read and write circuit 130, a control logic 140, and a voltage generator 150.

The memory cell array 110 includes a plurality of memory blocks BLK1 to BLKz connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may include non-volatile memory cells having a vertical channel structure. The memory cell array 110 may be configured as a memory cell array of a two-dimensional structure.

According to an embodiment, the memory cell array 110 may be configured as a memory cell array of a three-dimensional structure. Each of the plurality of memory cells included in the memory cell array may store at least one bit of data. In an embodiment, each of the plurality of memory cells included in the memory cell array 110 may be a single-level cell (SLC) storing one bit of data. In one embodiment, each of the plurality of memory cells included in the memory cell array 110 may be a multi-level cell (MLC) storing two bits of data. In one embodiment, each of the plurality of memory cells included in the memory cell array 110 may be a triple-level cell storing three bits of data. In one embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, and the voltage generator 150 may operate as a peripheral circuit that drives the memory cell array 110. The peripheral circuit may be operated under control of the control logic 140. The address decoder 120 is connected to the memory cell array 110 through the word lines WL, and may be configured to operate in response to control of the control logic 140. The address decoder 120 receives an address through an input/output buffer inside the semiconductor memory device 100.

The address decoder 120 is configured to decode a block address among received addresses. The address decoder 120 selects at least one memory block according to the decoded block address. The address decoder 120 applies a read voltage Vread generated in the voltage generator 150 to a selected word line of the selected memory block, at a time of a read voltage application operation during a read operation. At this time, the address decoder 120 applies a pass voltage Vpass to the remaining unselected word lines. During a program verify operation, the address decoder 120 applies a verify voltage generated in the voltage generator 150 to the selected word line of the selected memory block, and also may apply the pass voltage Vpass to the remaining unselected word lines.

The address decoder 120 is configured to decode a column address of the received addresses and transmit the decoded column address to the read and write circuit 130.

A read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a read circuit during a read operation of the memory cell array 110 and as a write circuit during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the page buffers PB1 to PBm may sense a change in the amount of current flowing through a sensing node, according to a program state of a corresponding memory cell. The page buffers PB1 to PBm may perform this operation while continuously supplying a sensing current to the bit lines connected to the memory cells, and may latch the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer of the semiconductor memory device 100. As an exemplary embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 may receive a command CMD and a control signal CTRL through the input/output buffer of the semiconductor memory device 100. The control logic 140 is configured to control overall operation of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110. The control logic controls the voltage generator 150 to generate various voltages used during the program operation of the memory cell array 110.

In addition, the control logic 140 controls the address decoder 120 to transfer the voltages generated by the voltage generator 150 to local lines of a memory block which is an operation target through global lines. Meanwhile, the control logic 140 controls the read and write circuit 130 to read data of a selected page of the memory block through the bit lines BL1 to BLm during the read operation and to store the data in the page buffers PB1 to PBm. In addition, the control logic 140 controls the read and write circuit 130 to program the data, which is stored in the page buffers PB1 to PBm, in the selected page during the program operation.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage and the voltage generator 150 may generate the plurality of voltages by selectively activating the pumping capacitors in response to control of the control logic 140.

The address decoder 120, the read and write circuit 130, and the voltage generator 150 may function as a "peripheral circuit" that performs a read operation, a write operation, and an erase operation on the memory cell array 110. The peripheral circuit performs the read operation, the write operation, and the erase operation on the memory cell array 110 based on the control of the control logic 140.

Figure 2:
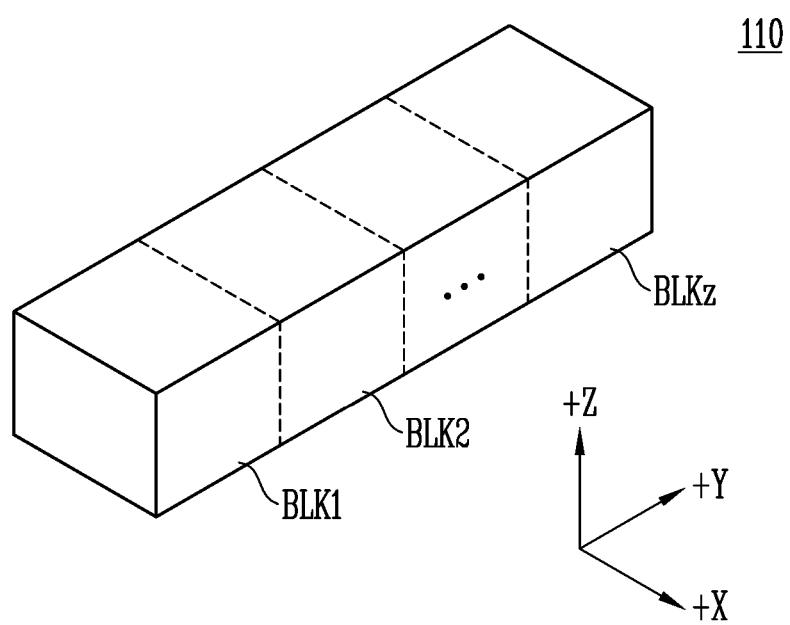
FIG. 2 illustrates an embodiment of a memory cell array.

FIG. 2 is a block diagram illustrating an embodiment of the memory cell array 110 which includes a plurality of memory blocks BLK1 to BLKz. Each memory block has a three-dimensional structure and includes a plurality of memory cells stacked on a substrate. Such plurality of memory cells are arranged along a +X direction, a +Y direction, and a +Z direction. Embodiments of each memory block is described with reference to FIGS. 3 and 4.

Figure 3:
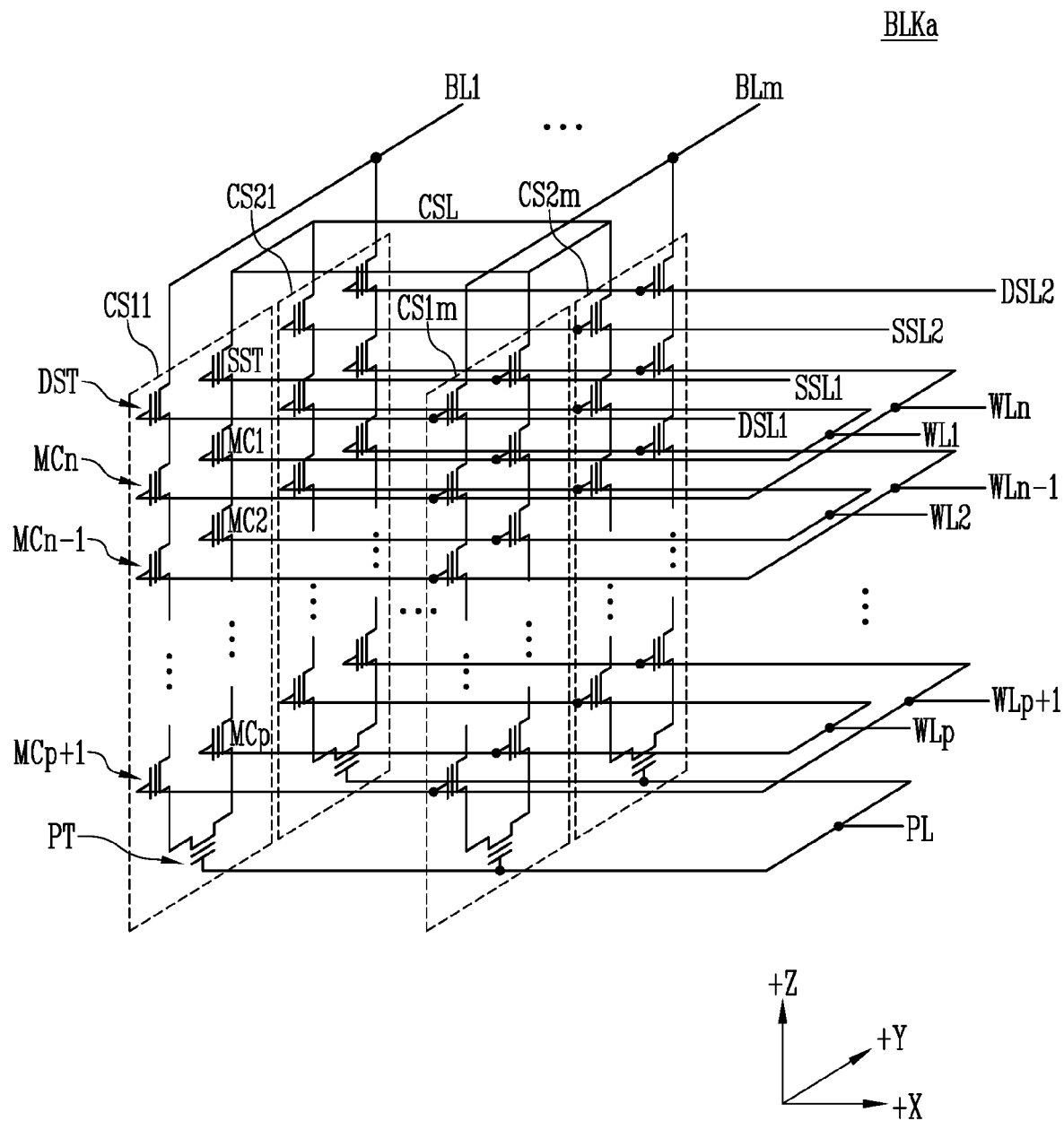
FIG. 3 illustrates an embodiment of a memory block.

FIG. 3 is a circuit diagram illustrating a memory block BLKa, which may be representative of the memory blocks BLK1 to BLKz of FIG. 2.

Referring to FIG. 3, the memory block BLKa includes a plurality of cell strings CS11 to CS1m and CS21 to CS2m. In an embodiment, each of the plurality of cell strings CS11 to CS1m and CS21 to CS2m may be formed in to have a predetermined shape, e.g., a 'U' shape or another shape. In the memory block BLKa, m cell strings are arranged in a row direction (e.g., +X direction). In FIG. 3, two cell strings are arranged in a column direction (e.g., +Y direction). Three or more cell strings may be arranged in the column direction in another embodiment.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST may have a similar structure, and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp. In an embodiment, the source select transistors of the cell strings arranged in the same row are connected to a source select line extending in the row direction. Also, the source select transistors of the cell strings arranged in different rows are connected to different source select lines. In FIG. 3, the source select transistors of the cell strings CS11 to CS1m of a first row are connected to a first source select line SSL1. The source select transistors of the cell strings CS21 to CS2m of a second row are connected to a second source select line SSL2.

In an embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST. The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and pipe transistor PT.

The (p+1)-th to n-th memory cells MCp+1 to MCn are sequentially arranged in the +Z direction and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 3, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1 (among the cell strings CS11 to CS1m of the first row) may configure one page. The memory cells connected to the first word line WL1 (among the cell strings CS21 to CS2m of the second row) may configure another page. The cell strings arranged in one row direction may be selected by selecting one of the drain select lines DSL1 and DSL2. One page of the selected cell strings may be selected by selecting any one of the word lines WL1 to WLn.

In one embodiment, even bit lines and odd bit lines may be provided instead of the first to m-th bit lines BL1 to BLm. Among the cell strings CS11 to CS1m or CS21 to CS2m, even-numbered cell strings arranged in the row direction may be connected to the even bit lines and odd-numbered cell strings arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. In one embodiment, at least one dummy memory cell is provided to reduce an electric field between the drain select transistor DST and the memory cells MCp+1 to MCn. As more dummy memory cells are provided, reliability of operation of the memory block BLKa may improve, but the size of the memory block BLKa increases. As less dummy memory cells are provided, the size of the memory block BLKa may be reduced, but reliability of operation of the memory block BLKa may be reduced.

In order to efficiently control at least one dummy memory cell, each of the dummy memory cells may have a threshold voltage. Before or after an erase operation for the memory block BLKa, program operations for all or a part of the dummy memory cells may be performed. When the erase operation is performed after the program operation is performed, the dummy memory cells may have the threshold voltage by controlling a voltage applied to dummy word lines connected to the respective dummy memory cells.

Figure 4:
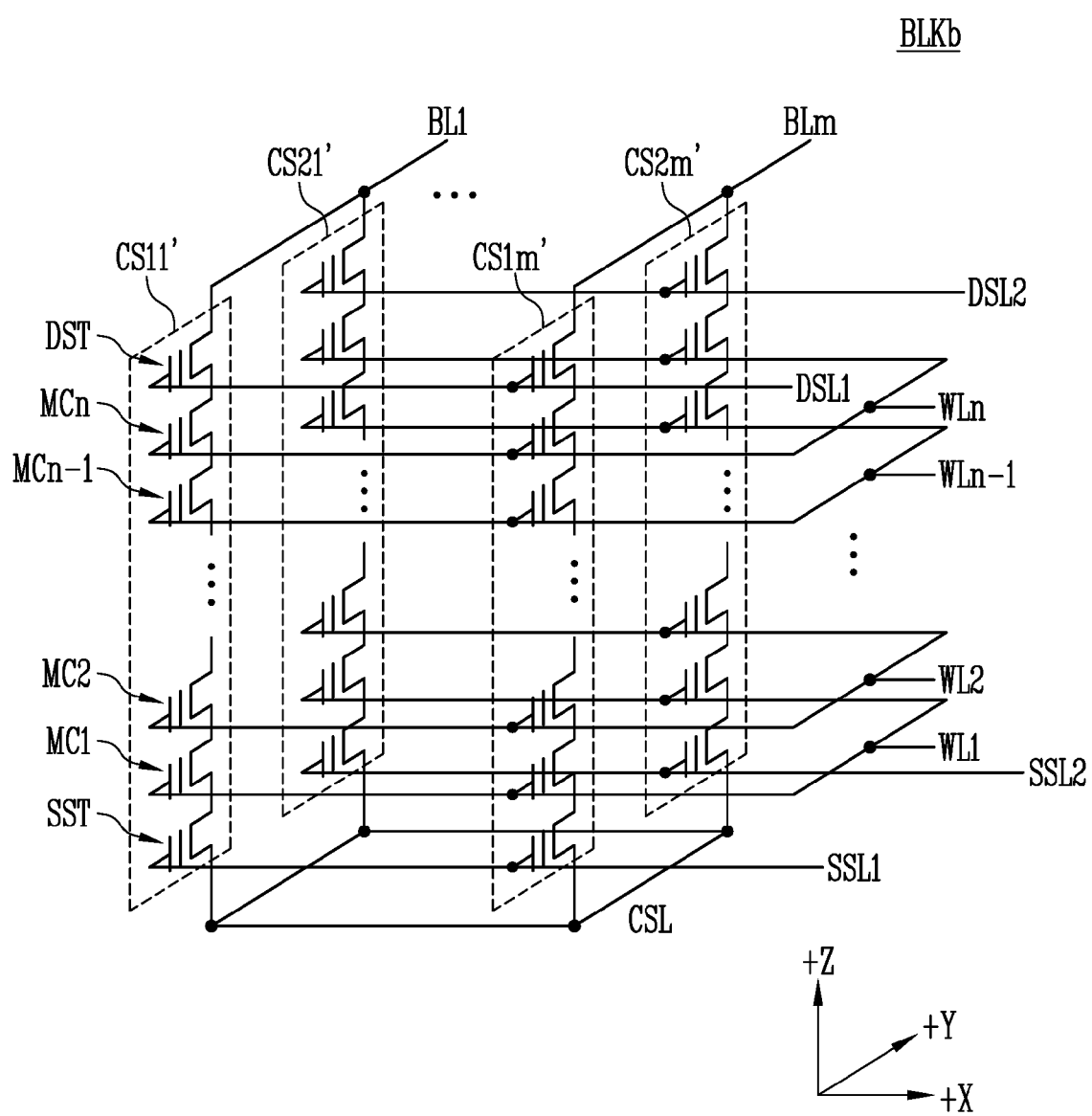
FIG. 4 illustrates an embodiment of a memory block.

FIG. 4 is a circuit diagram illustrating an embodiment of a memory block BLKb, which may be representative of the memory blocks BLK1 to BLKz of FIG. 2.

Referring to FIG. 4, the memory block BLKb includes a plurality of cell strings CS11' to CS1m' and CS21' to CS2m'. Each of the plurality of cell strings CS11' to CS1m' and CS21' to CS2m' extends along a +Z direction, and may include at least one source select transistor SST, first to n-th memory cells MC1 to MCn, and at least one drain select transistor DST stacked on a substrate under the memory block BLK1'.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. In an embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 4 may have an equivalent circuit similar to that of memory block BLKa of FIG. 3, except that pipe transistor PT is excluded from each cell string.

In one embodiment, even bit lines and odd bit lines may be provided instead of first to m-th bit lines BL1 to BLm. Among cell strings CS11' to CS1m' or CS21' to CS2m', even-numbered cell strings arranged in the row direction may be connected to even bit lines and odd-numbered cell strings arranged in the row direction may be connected to odd bit lines, respectively.

In an embodiment, at least one of the first to n-th memory cells MC1 to MCn may be used as a dummy memory cell. For example, at least one dummy memory cell may be provided to reduce an electric field between the source select transistor SST and the memory cells MC1 to MCn. In one embodiment, at least one dummy memory cell is provided to reduce an electric field between the drain select transistor DST and the memory cells MC1 to MCn. As more dummy memory cells are provided, reliability of operation for memory block BLKb may be improved, but the size of memory block BLKb increases. As less dummy memory cells are provided, the size of memory block BLKb may be reduced, but reliability of operation for memory block BLKb may be reduced.

In order to efficiently control at least one dummy memory cell, each of the dummy memory cells may have a threshold voltage. Before or after an erase operation for the memory block BLKb, program operations for all or a part of the dummy memory cells may be performed. When the erase operation is performed after the program operation is performed, the dummy memory cells may have the threshold voltage by controlling a voltage applied to the dummy word lines connected to the respective dummy memory cells.

Figure 5:
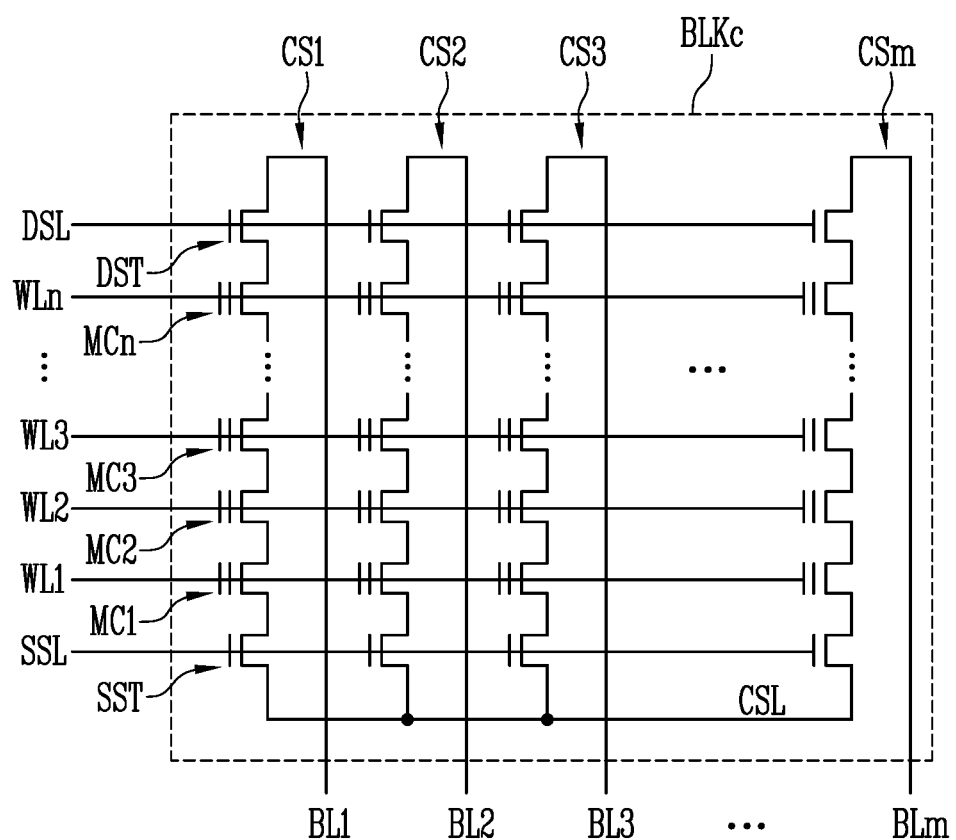
FIG. 5 illustrates an embodiment of a memory block.

FIG. 5 is a circuit diagram of an embodiment of memory block BLKc, which may be representative of memory blocks BLK1 to BLKz in the memory cell array 110 of FIG. 1.

Referring to FIG. 5, memory block BLKc includes a plurality of cell strings CS1 to CSm connected to a plurality of bit lines BL1 to BLm, respectively. Each of the cell strings CS1 to CSm includes at least one source select transistor SST, first to n-th memory cells MC1 to MCn, and at least one drain select transistor DST.

The select transistors SST and DST may have a similar structure, and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn. The first to n-th memory cells MC1 to MCn of each cell string are connected between the source select transistor SST and the drain select transistor DST. The drain select transistor DST of each cell string is connected between a corresponding bit line and the memory cells MC1 to MCn.

Memory cells connected to the same word line may configure one page. The cell strings CS1 to CSm may be selected by selecting the drain select line DSL. One page among the selected cell strings may be selected by selecting any one of the word lines WL1 to WLn.

In one embodiment, even bit lines and odd bit lines may be provided instead of the first to m-th bit lines BL1 to BLm. Among the cell strings CS1 to CSm, even-numbered cell strings may be connected to even bit lines and odd-numbered cell strings may be connected to odd bit lines, respectively.

As shown in FIGS. 2 to 4, the memory cell array 110 of the semiconductor memory device 100 may be configured as a memory cell array of a three-dimensional structure. As shown in FIG. 5, the memory cell array 110 of the semiconductor memory device 100 may be configured as a memory cell array of a two-dimensional structure.

Figure 6:
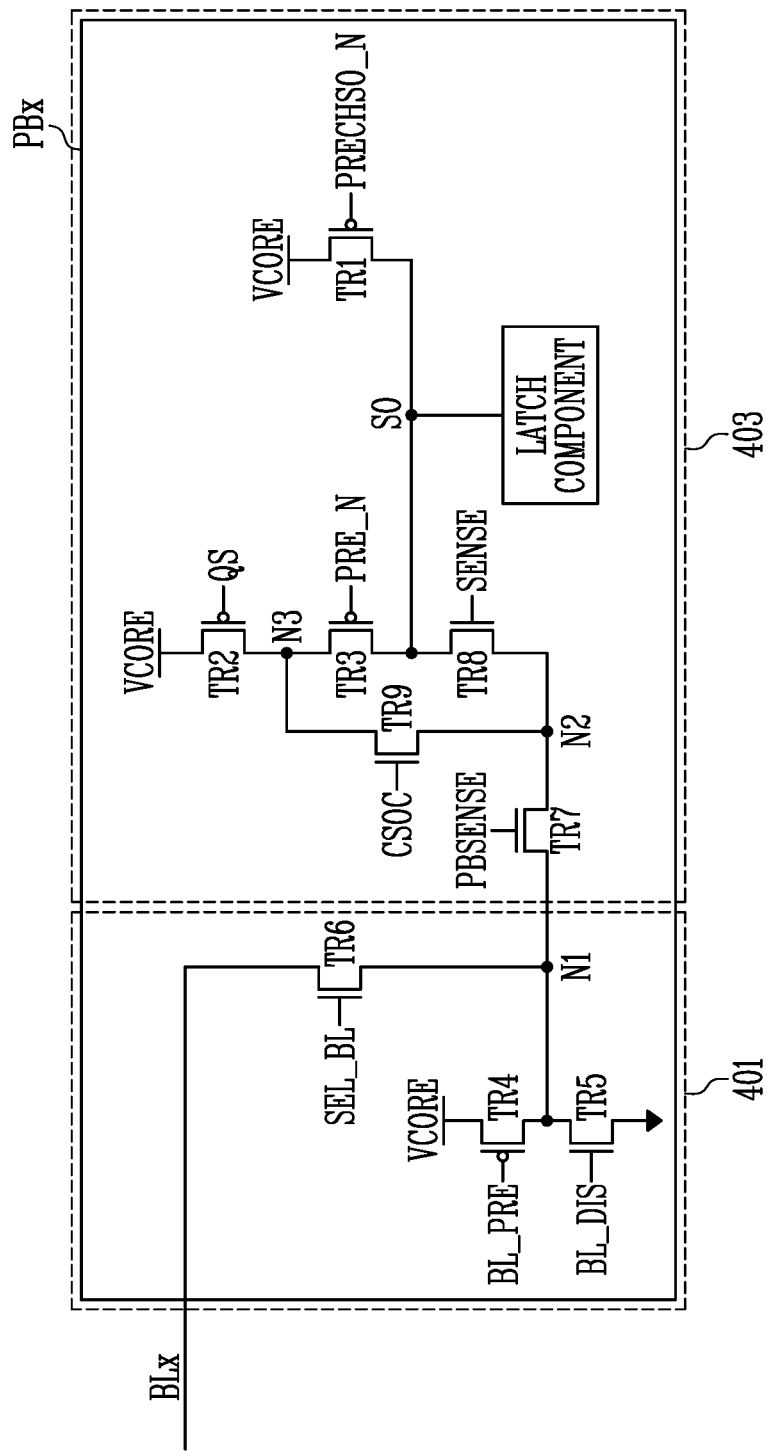
FIG. 6 illustrates an embodiment of a page buffer.

FIG. 6 is a diagram illustrating an embodiment of a configuration of each page buffer PBx in a read and write circuit of the semiconductor memory device shown in FIG. 1. The page buffer PBx may be representative of page buffers PB1 to PBm in the read and write circuit 130 of FIG. 1, and a bit line BLx is shown as being connected to the page buffer PBx.

The read and write circuit 130 may include the plurality of page buffers PB1 to PBm. Each of the plurality of page buffers PB1 to PBm included in the read and write circuit 130 may include a bit line transistor component 401 and a sensing transistor component 403. The bit line transistor component 401 may include fourth to sixth transistors TR4 to 6, and the sensing transistor component 403 may include first to third and seventh to ninth transistors TR1 to 3 and TR7 to 9 and a latch component. Thus, in this example, each page buffer may include the first to ninth transistors TR1 to 9 and the latch component. The latch component may be configured of transistors that store data sensed through the bit line BLx. The first to ninth transistors TR1 to 9 may be turned on or off to adjust a voltage applied to bit line BLx.

The first transistor TR1 may be a sensing node precharge transistor connected between power VCORE and a sensing node SO. The first transistor TR1 may be turned on or off by a sensing node precharge signal PRECHSO_N. When the first transistor TR1 is turned on by the sensing node precharge signal PRECHSO_N, the power VCORE and the sensing node SO may be connected to each other. For example, a current path may be formed between the power VCORE and the sensing node SO by the sensing node precharge signal PRECHSO_N. In an embodiment, first transistor TR1 may be implemented with a PMOS transistor, but may be implemented with an NMOS transistor in another embodiment.

The second transistor TR2 may be a data transmission transistor connected between the power VCORE and a third node N3. The second transistor TR2 may be turned on or off by a data transmission signal QS. When the second transistor TR2 is turned on by the data transmission signal QS, the power VCORE and the third node N3 may be connected to each other. For example, a current path may be formed between the power VCORE and the third node N3 by the data transmission signal QS. In an embodiment, second transistor TR2 may be implemented with a PMOS transistor but may be implemented with an NMOS transistor in another embodiment.

The third transistor TR3 may be a precharge transistor connected between the third node N3 and the sensing node SO. The third transistor TR3 may be turned on or off by a precharge signal PRE_N. When the third transistor TR3 is turned on by the precharge signal PRE_N, the third node N3 and the sensing node SO may be connected to each other. For example, a current path may be formed between the third node N3 and the sensing node SO by the precharge signal PRE_N. In an embodiment, third transistor TR3 may be implemented with a PMOS transistor, but may be an NMOS transistor in another embodiment.

The fourth transistor TR4 may be a bit line precharge transistor connected between the power VCORE and the first node N1. The fourth transistor TR4 may be turned on or off by a bit line precharge signal BL_PRE. When the fourth transistor TR4 is turned on by the bit line precharge signal BL_PRE, the power VCORE and the first node N1 may be connected to each other. For example, a current path may be formed between the power VCORE and the first node N1 by the bit line precharge signal BL_PRE. In an embodiment, fourth transistor TR4 may be implemented with a PMOS transistor, but may be an NMOS transistor in another embodiment.

The fifth transistor TR5 may be a bit line discharge transistor connected between the first node N1 and a reference potential, e.g., ground. The fifth transistor TR5 may be turned on or off by a bit line discharge signal BL_DIS. When the fifth transistor TR5 is turned on by the bit line discharge signal BL_DIS, the first node N1 and the ground may be connected to each other. For example, a current path may be formed between the first node N1 and the ground by the bit line discharge signal BL_DIS. In an embodiment, fifth transistor TR5 may be implemented with an NMOS transistor, but may be a PMOS transistor in another embodiment.

The sixth transistor TR6 may be a bit line select transistor connected between the first node N1 and the bit line connected to one of the page buffers. The sixth transistor TR6 may be turned on or off by a bit line select signal SEL_BL. When the sixth transistor TR6 is turned on by the bit line select signal SEL_BL, the bit line and the first node N1 may be connected to each other. For example, a current path may be formed between the bit line and the first node N1 by the bit line select signal SEL_BL. In an embodiment, sixth transistor TR6 may be implemented with an NMOS transistor but may be a PMOS transistor in another embodiment.

The seventh transistor TR7 may be a sensing transistor connected between the first node N1 and a second node N2. The seventh transistor TR7 may be turned on or off by a sensing signal PBSENSE. When the seventh transistor TR7 is turned on by the sensing signal PBSENSE, the first node N1 and the second node N2 may be connected. For example, a current path may be formed between the first node N1 and the second node N2 by the sensing signal PBSENSE. In an embodiment, seventh transistor TR7 may be implemented with an NMOS transistor but may be a PMOS transistor in another embodiment.

The eighth transistor TR8 may be a sensing transmission transistor connected between the sensing node SO and the second node N2. The eighth transistor TR8 may be turned on or off by a sensing transmission signal SENSE. When the eighth transistor TR8 is turned on by the sensing transmission signal SENSE, the sensing node SO and the second node N2 may be connected. For example, a current path may be formed between the sensing node SO and the second node N2 by the sensing transmission signal SENSE. In an embodiment, eighth transistor TR8 may be implemented with an NMOS transistor but may be a PMOS transistor in another embodiment.

The ninth transistor TR9 may be a precharge transmission transistor connected between the second node N2 and the third node N3. The ninth transistor TR9 may be turned on or off by a precharge transmission signal CSOC. When the ninth transistor TR9 is turned on by the precharge transmission signal CSOC, the second node N2 and the third node N3 may be connected to each other. For example, a current path may be formed between the second node N2 and the third node N3 by the precharge transmission signal CSOC. In an embodiment, ninth transistor TR9 may be implemented with a PMOS transistor but may be an NMOS transistor in another embodiment.

In an embodiment, during a sensing operation, the sensing node SO and the latch component may be connected. During the sensing operation, the data sensed through the bit line may be stored in the latch component. During the sensing operation, the control logic may control the peripheral circuit to turn on or off the data transmission transistor (the second transistor TR2), the precharge transmission transistor (the ninth transistor TR9), and the precharge transistor (the third transistor TR3), so that the sensing node SO and the latch component are connected. In one embodiment, during the sensing operation, the control logic may control the peripheral circuit to turn on or off the sensing transmission transistor (the eighth transistor TR8) so that the sensing node SO and the latch component are connected.

Referring to FIG. 6, an example structure of page buffer PBx is shown. In one embodiment, the page buffer PBx may have other structures connected to the bit line to perform the read operation.

Figure 7:
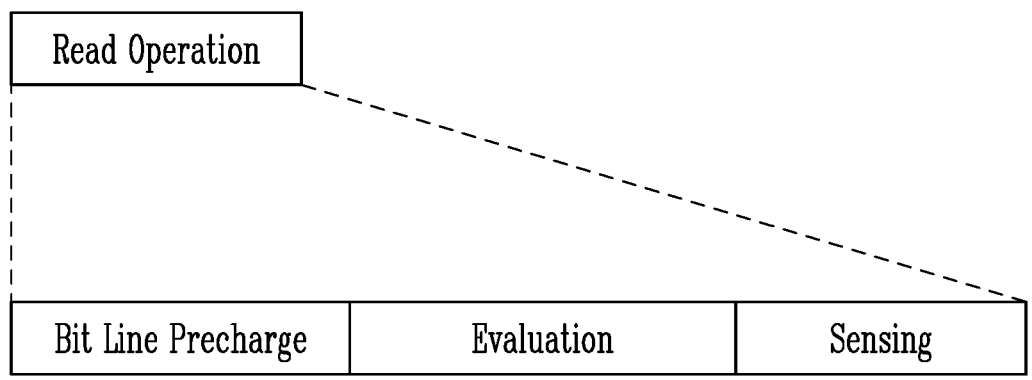
FIG. 7 illustrates an embodiment of operations included in a read operation.

FIG. 7 is a diagram illustrating an embodiment of operations that may be performed or included in a read operation.

Referring to FIG. 7, the read operation may include a bit line precharge operation, an evaluation operation, and a sensing operation. The read operation may include sensing a result or information indicating whether a threshold voltage of one or more memory cells selected as a read target is greater than or less than a corresponding read voltage. This may be accomplished using one read voltage, and the result may be stored in the latch component in the page buffer PBx. In order to read data of a single-level cell (SLC), the read operation shown in FIG. 7 may be performed once. In order to read data of a multi-level cell (MLC), the read operation shown in FIG. 7 may be performed multiple times, e.g., three times. In addition, in order to read data of a triple-level cell (TLC), the read operation shown in FIG. 7 may be performed multiple times, e.g., seven times.

The bit line precharge operation may include increasing a voltage of a bit line connected to the memory cells selected as the read target to a precharge voltage.

The evaluation operation may include evaluating the threshold voltage of each of the selected memory cells. For example, among the selected memory cells, memory cells having a threshold voltage higher than a read voltage (e.g., a bit line connected to an off-cell) may maintain the precharge voltage in the evaluation operation. For memory cells having a threshold voltage lower than the read voltage (e.g., a bit line connected to an on-cell), the voltage may decrease during the evaluation operation. Therefore, a voltage of a corresponding bit line may be distinguished according to the threshold voltage of each memory cell.

The sensing operation may include storing bit data (e.g., information) indicating whether each of the selected memory cells is an on-cell or an off-cell in the latch component. This operation may be performed, for example, based on the voltage of the bit line distinguished as described above.

In the read operation according to the exemplary embodiment, a reference (e.g., ground) voltage Vss may be applied to a common source line connected to the memory block during the bit line precharge period, the evaluation period, and the sensing period. This is because the common source line voltage is to maintain the reference voltage in order to distinguish the bit line voltage according to the threshold voltage of each memory cell in the evaluation operation. Therefore, a voltage of the common source line may be maintained as the reference voltage Vss in all (or predetermined) operations of the read operation including the evaluation operation.

When the voltage of the common source line is maintained as the reference voltage Vss, an average current or a peak current flowing through the common source line CSL may increase during a partial period of the read operation.

According to a method of operating a semiconductor memory device according to embodiments, the reference (e.g., ground) voltage Vss applied to the common source line may be cut off during at least a partial period of the read operation. Thus, in at least a partial period of the read operation, the common source line CSL may be floated instead of maintaining the voltage of the common source line CSL as a specific voltage, for example, reference voltage Vss. Therefore, a problem that the average current or the peak current flowing through the common source line CSL increases may be prevented. A method of operating a semiconductor memory device according to an embodiment is described with reference to FIG. 8.

Figure 8:
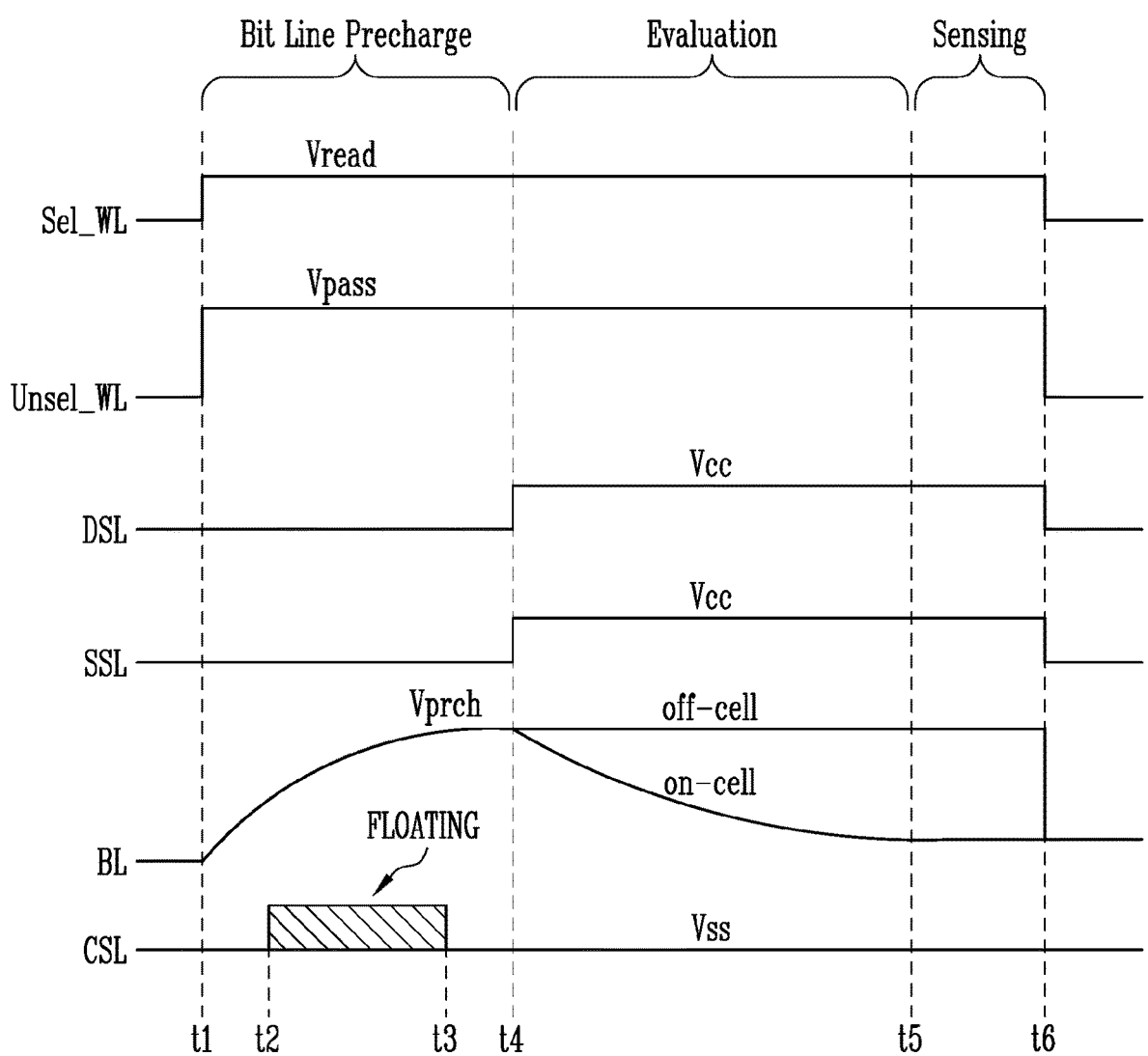
FIG. 8 illustrates an embodiment of a method of operating a semiconductor memory device.

FIG. 8 is a timing diagram illustrating a method of operating a semiconductor memory device according to an embodiment. The timing diagram includes voltages of a selected word line Sel_WL, an unselected word line Unsel_WL, a drain select line DSL, a source select line SSL, a bit line BL, and a common source line CSL during the read operation of the semiconductor memory device.

At time t1, the bit line precharge operation may be started and read voltage Vread may be applied to the selected word line Sel_WL, and pass voltage Vpass may be applied to the unselected word line Unsel_WL. The pass voltage Vpass may be greater than the read voltage Vread, and may be a voltage capable of turning on all corresponding memory cells regardless of the threshold voltages of each of the memory cells in the selected memory block. Therefore, memory cells connected to unselected word line Unsel_WL may maintain a turn-on state from time t1.

As the read voltage Vread is applied to the selected word line Sel_WL, memory cells having a threshold voltage lower than the read voltage Vread among the memory cells connected to the selected word line Sel_WL may be turned on. Also, memory cells having a threshold voltage higher than the read voltage Vread among the memory cells connected to the selected word line Sel_WL may be turned off.

As the bit line precharge operation is started, a voltage of the bit line BL may start to increase at the time t1. The voltage of the bit line BL may increase to a precharge voltage Vprch at a time t4.

According to the method of operating semiconductor memory device 100, in an embodiment the common source line CSL may be floated in a partial period of the bit line precharge operation. For example, the common source line CSL may be floated from a time t2 to a time t3, and a reference (e.g., ground) voltage Vss may be applied to the common source line CSL in a period except for the period from time t2 to time t3.

In the embodiment shown in FIG. 8, the common source line CSL is floated only in a partial period t2 to t3 of period t1 to t4 corresponding to the bit line precharge operation. In one embodiment, the common source line CSL may be floated for a different period of time, e.g., the common source line CSL may be floated during any period of period t1 to t4 corresponding to the bit line precharge operation. For example, the common source line CSL may be floated during the entire period t1 to t4 corresponding to the bit line precharge operation.

At time t4, the bit line precharge operation may be ended and the evaluation operation may be started. At time t4, a power voltage Vcc may be applied to the drain select line DSL and the source select line SSL to start the evaluation operation. The power voltage Vcc may be one capable of turning on the drain select transistor DST and the source select transistor SST. When the drain select transistor DST and the source select transistor SST are turned on, cell strings in the selected memory block are connected to the common source line CSL and corresponding bit lines BL. Thereafter, the voltage of the bit line BL is changed or maintained according to a threshold voltage level of each of the memory cells connected to the selected word line Sel_WL.

In the timing diagram embodiment shown in FIG. 8, the read voltage Vread is applied to the selected word line Sel_WL and the pass voltage Vpass is applied to the unselected word line Unsel_WL from the bit line precharge operation. In one embodiment, the reference voltage Vss may be applied to the selected word line Sel_WL and the unselected word line Unsel_WL in the bit line precharge operation, and the read voltage Vread may be applied to the selected word line Sel_WL and the pass voltage Vpass may be applied to the unselected word line Unsel_WL in the evaluation operation.

Among the memory cells connected to the selected word line Sel_WL, memory cells having a threshold voltage higher than the read voltage Vread are turned off. Accordingly, since one of the memory cells in the corresponding cell string is turned off, a current path between the common source line CSL and the bit line BL may be blocked. Therefore, the bit line connected to the turned-off cells (e.g., an off-cell) may maintain the precharge voltage Vprch.

Among the memory cells connected to the selected word line Sel_WL, the memory cells having the threshold voltage lower than the read voltage Vread are turned on. Accordingly, since all memory cells in the corresponding cell string are turned on, a current path may be formed between the common source line CSL and the bit line BL. Therefore, the voltage of the bit line connected to the turned-on cells (e.g., the on-cell) gradually decreases, e.g., at a predetermined rate below a threshold rate.

At time t5, the evaluation operation may be ended and the sensing operation may be started. During period t5 to t6, the page buffer may sense each bit line voltage and store the sensed result as bit data in the latch component. Accordingly, the read operation using the read voltage Vread may be completed.

As shown in FIG. 8, according to one embodiment of the method of operating the semiconductor memory device, the common source line CSL may be floated in at least a partial period t2 to t3 of the bit line precharge operation. Accordingly, an increase in the average current or peak current flowing through the common source line CSL may be reduced or prevented. As a result, power consumption used for the read operation of the semiconductor memory device 100 may be reduced.

Figure 9:
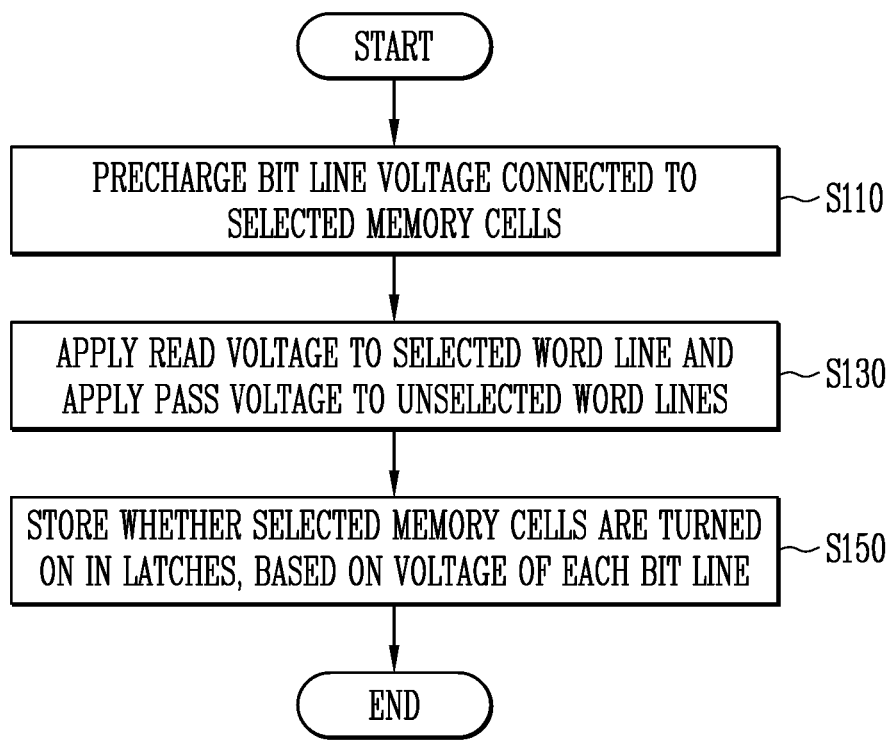
FIG. 9 illustrates an embodiment of a method of operating a semiconductor memory device.
Figure 10:
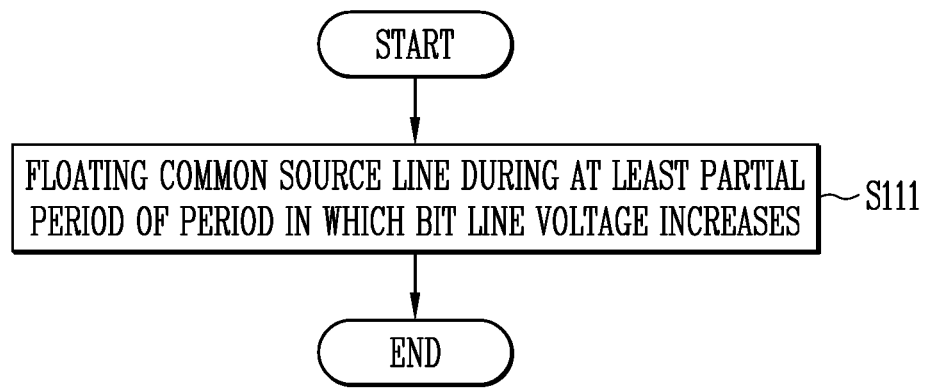
FIG. 10 illustrates an embodiment of a memory operation.
Figure 11:
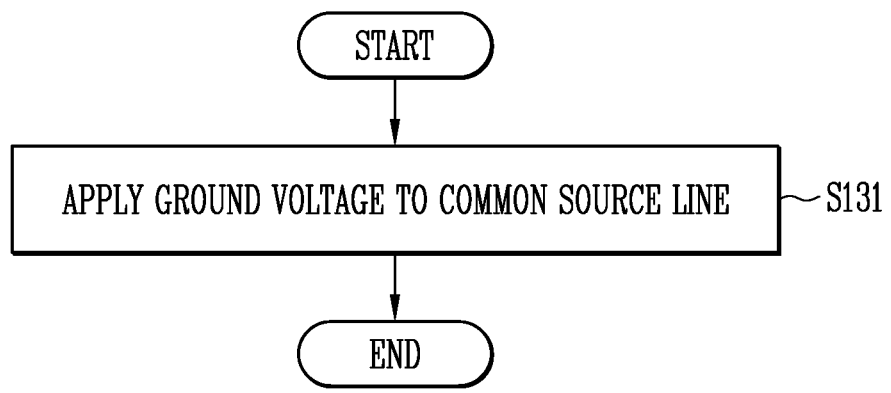
FIG. 11 illustrates an embodiment of a memory operation.

FIG. 9 is a flowchart illustrating an embodiment of a method of operating a semiconductor memory device. FIG. 10 is a flowchart illustrating an exemplary embodiment of operation S110 of FIG. 9. FIG. 11 is a flowchart illustrating an exemplary embodiment of operation S130 of FIG. 9. Thus, an embodiment of a method of operating the semiconductor memory device may be described with reference to FIGS. 9 to 11.

Referring to FIG. 9, the method includes precharging a voltage of a bit line BL connected to selected memory cells (S110), applying a read voltage to a selected word line and applying a pass voltage to unselected word lines (S130), and storing information indicating whether or not the selected memory cells are turned on in latches based on the voltage of each bit line (S150).

Operation S110 may correspond to the bit line precharge operation of the read operation shown in FIG. 7. Also, operation S110 may correspond to an operation performed in the period t1 to t4 shown in FIG. 8. The period t1 to t4 shown in FIG. 8 may correspond to the bit line precharge operation. In the bit line precharge operation, the read voltage Vread is applied to the selected word line Sel_WL and the pass voltage Vpass is applied to the unselected word line Unsel_WL.

Thus, according to this method of operating the semiconductor memory device, the common source line CSL may be floated in at least a partial period t2 to t3 of the bit line precharge operation. For example, operation S110 of FIG. 9 may include floating the common source line CSL during at least a partial period of a period in which the bit line voltage increases (S111) as shown in FIG. 10. Because the common source line CSL floats during at least a partial period of the bit line precharge operation, an increase in the average current or peak current flowing through the common source line CSL may be reduced or prevented. As a result, power consumption used for the read operation of the semiconductor memory device 100 may be reduced.

Operation S130 may correspond to the evaluation operation of the read operation shown in FIG. 7. For example, operation S130 may be performed in period t4 to t5 shown in FIG. 8. Period t4 to t5 shown in FIG. 8 may correspond, for example, to the evaluation operation.

In the evaluation operation, the read voltage Vread may be applied to the selected word line Sel_WL and the pass voltage Vpass may be applied to the unselected word line Unsel_WL. In the timing diagram shown in FIG. 8, an embodiment in which the read voltage Vread is applied to the selected word line Sel_WL and the pass voltage Vpass is applied to the unselected word line Unsel_WL from the bit line precharge operation is shown. In one embodiment, the reference (e.g., ground) voltage Vss may be applied to the selected word line Sel_WL and the unselected word line Unsel_WL in the bit line precharge operation. Also, the read voltage Vread may be applied to the selected word line Sel_WL and the pass voltage Vpass may be applied to the unselected word line Unsel_WL in the evaluation operation. The reference voltage Vss may be different from a ground voltage in one or more other embodiments.

In the evaluation operation, the voltage level of the common source line CSL may be maintained at the reference voltage Vss in order to lower the voltage of the bit line connected to the on-cell. For example, operation S130 of FIG. 9 may include applying the reference voltage to the common source line (S131) shown in FIG. 11.

Operation S150 may correspond to the sensing operation of the read operation shown in FIG. 7. For example, operation S150 may correspond to an operation performed in period t5 to t6 shown in FIG. 8. The period t5 to t6 shown in FIG. 8 may correspond to the evaluation operation. In the evaluation operation, the page buffer PBx may store a bit value corresponding to a current of each bit line in the latch component.

Figure 12:
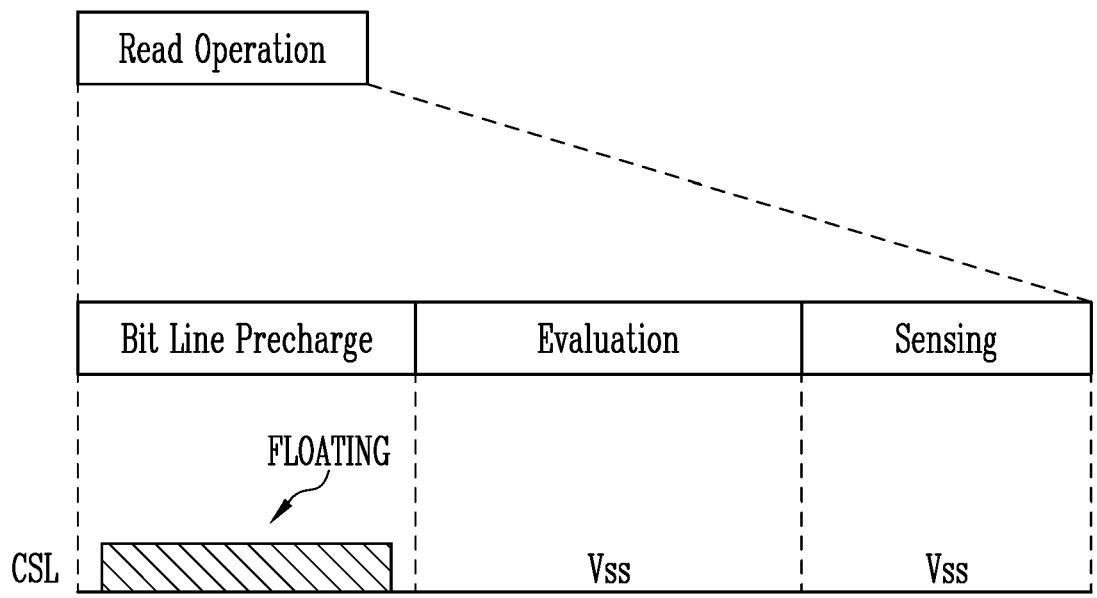
FIG. 12 illustrates an embodiment of a method of operating a semiconductor memory device.

FIG. 12 is a diagram schematically illustrating an embodiment corresponding to FIG. 8. Referring to FIG. 12, in addition to the read operation shown in FIG. 7 and operations included therein, a voltage of the common source line CSL is shown in each operation. Thus, according to a method of operating the semiconductor memory device according to an embodiment, the common source line CSL is floated in at least a partial period of the bit line precharge operation included in the read operation. Accordingly, an increase in the average current or peak current flowing through the common source line CSL increases may be reduced or prevented. As a result, power consumption used for the read operation of the semiconductor memory device 100 may be reduced.

Figure 13:
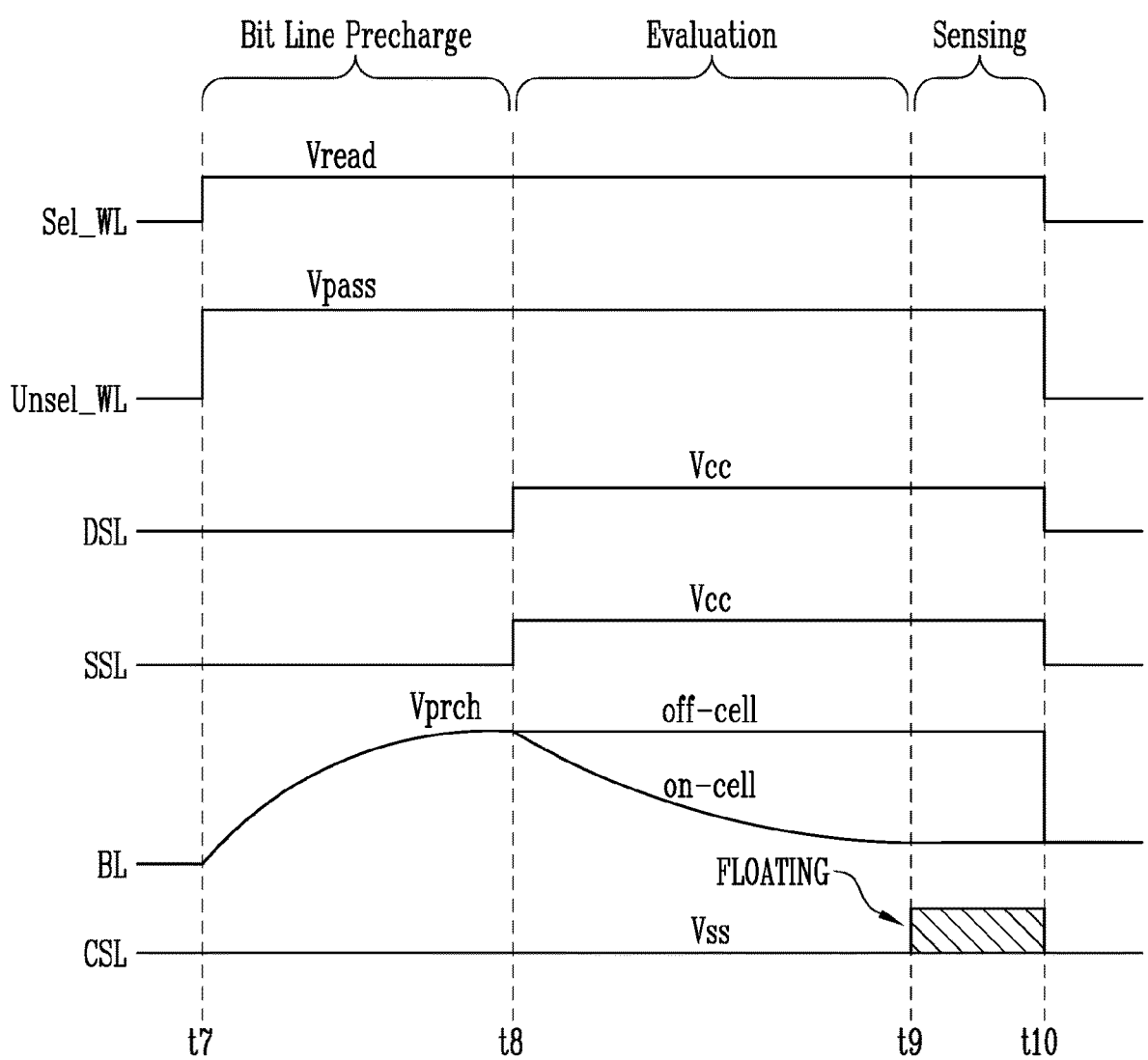
FIG. 13 illustrates an embodiment of a method of operating a semiconductor memory device.

FIG. 13 is a timing diagram illustrating an embodiment of a method of operating a semiconductor memory device. This timing diagram shows voltages of a selected word line Sel_WL, an unselected word line Unsel_WL, a drain select line DSL, a source select line SSL, a bit line BL, and a common source line CSL during the read operation of the semiconductor memory device.

Referring to FIG. 13, at time t7, the bit line precharge operation may be started and the read voltage Vread may be applied to the selected word line Sel_WL and the pass voltage Vpass may be applied to the unselected word line Unsel_WL. The pass voltage Vpass may be greater than the read voltage Vread and may be capable of turning on all corresponding memory cells, regardless of the threshold voltages of the memory cells in the selected memory block.

Therefore, all memory cells connected to the unselected word line Unsel_WL may maintain a turn-on state from time t7.

Because the read voltage Vread is applied to the selected word line Sel_WL, memory cells having a threshold voltage lower than the read voltage Vread (among the memory cells connected to the selected word line Sel_WL) may be turned on. Memory cells having a threshold voltage higher than the read voltage Vread (among the memory cells connected the selected word line Sel_WL) may be turned off.

As the bit line precharge operation is started, the voltage of the bit line BL may start to increase at time t7. The voltage of the bit line BL may increase to a precharge voltage Vprch at time t8.

At time t8, the bit line precharge operation may be ended and the evaluation operation may be started. At time t8, a power voltage Vcc may be applied to the drain select line DSL and the source select line SSL to start the evaluation operation. The power voltage Vcc is a voltage capable of turning on the drain select transistor DST and the source select transistor SST. Because the drain select transistor DST and the source select transistor SST are turned on, cell strings included in the selected memory block are connected to the common source line CSL and corresponding bit lines BL. Thereafter, the voltage of the bit line BL is changed or maintained according to a threshold voltage level of each of the memory cells connected to the selected word line Sel_WL.

In the timing diagram shown in FIG. 13, the read voltage Vread is applied to the selected word line Sel_WL and the pass voltage Vpass is applied to the unselected word line Unsel_WL from the bit line precharge operation. In one embodiment, the reference voltage Vss may be applied to the selected word line Sel_WL and the unselected word line Unsel_WL in the bit line precharge operation, and the read voltage Vread may be applied to the selected word line Sel_WL and the pass voltage Vpass may be applied to the unselected word line Unsel_WL in the evaluation operation.

Among the memory cells connected to the selected word line Sel_WL, the memory cells having the threshold voltage higher than the read voltage Vread are turned off. Accordingly, because one of the memory cells included in the corresponding cell string is turned off, the current path between the common source line CSL and the bit line BL may be blocked. Therefore, the bit line connected to the turned-off cells (e.g., the off-cell) may maintain the precharge voltage Vprch.

Among the memory cells connected to the selected word line Sel_WL, the memory cells having the threshold voltage lower than the read voltage Vread are turned on. Accordingly, since all memory cells included in the corresponding cell string are turned on, a current path may be formed between the common source line CSL and the bit line BL. Therefore, the voltage of the bit line connected to the turned-on cells (e.g., the on-cell) may gradually decreases, e.g., may decrease at a predetermined rate.

At time t9, the evaluation operation may be ended and the sensing operation may be started. During period t9 to t10, the page buffer may sense each bit line voltage and store the sensed result as bit data in the latch component. Accordingly, the read operation using the read voltage Vread may be completed.

Thus, according to an embodiment, the common source line CSL may be floated in a partial period of the bit line sensing operation. For example, the common source line CSL may be floated from time t9 to time t10 and the reference voltage Vss may be applied to the common source line CSL in a period except for the period from time t9 to time t10.

In the embodiment shown in FIG. 13, the common source line CSL is floated during the entire period t9 to t10 corresponding to the sensing operation. In one embodiment, the common source line CSL may be floated only in a partial period of the period t9 to t10 corresponding to the sensing operation.

As shown in FIG. 13, according to one embodiment, the common source line CSL may be floated in period t9 to t10 corresponding to the sensing operation. Accordingly, an increase in the average current or peak current flowing through the common source line CSL may be reduced or prevented. As a result, power consumption used for the read operation of the semiconductor memory device 100 may be reduced.

Figure 14:
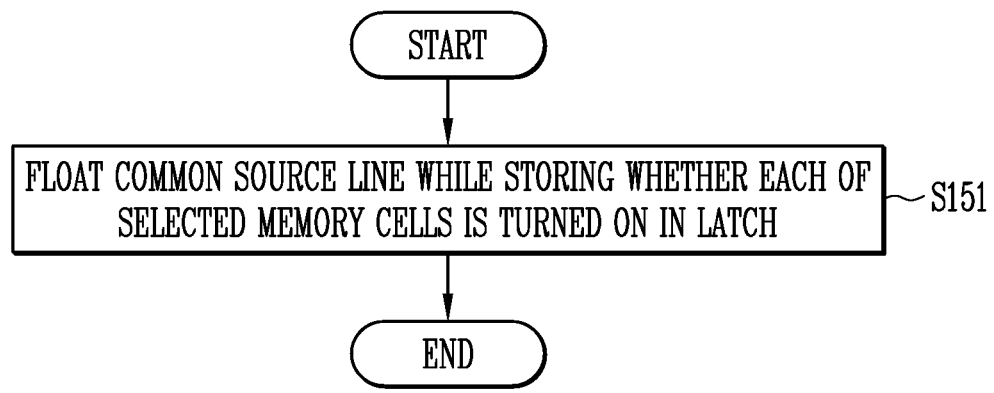
FIG. 14 illustrates an embodiment of a method of operating a semiconductor memory device.

FIG. 14 is a flowchart illustrating an exemplary embodiment of operation S150 of FIG. 9. According to one embodiment, the common source line CSL may be floated in period t9 to t10 corresponding to the sensing operation. Accordingly, operation S150 shown in FIG. 9 may include floating the common source line while storing information indicating whether each of the selected memory cells is turned on in the latch (S151).

Figure 15:
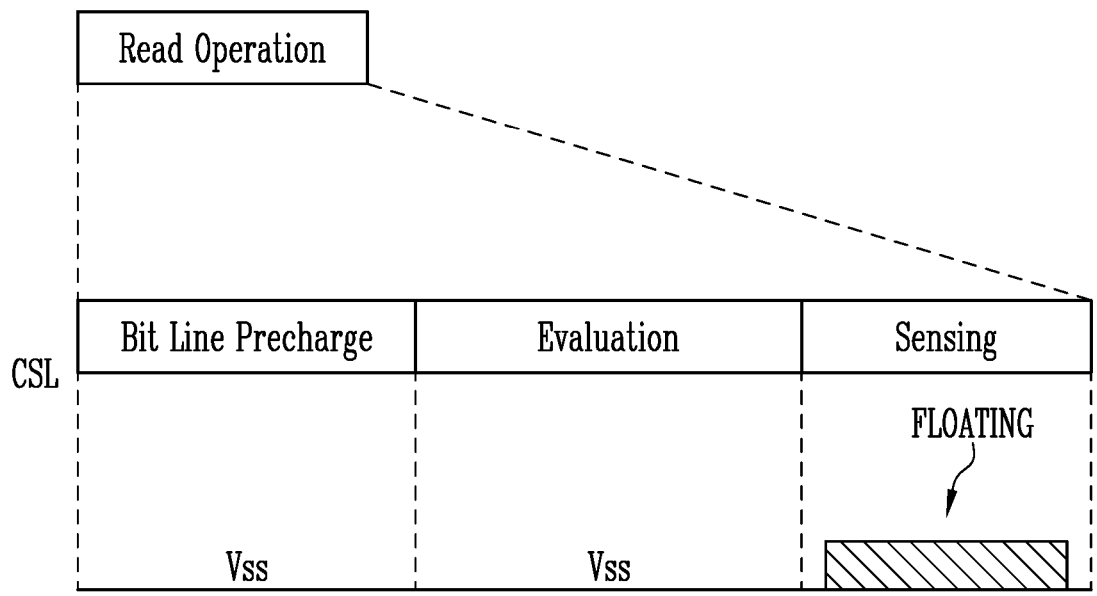
FIG. 15 illustrates an embodiment of a method of operating a semiconductor memory device.

FIG. 15 is a diagram schematically illustrating an embodiment corresponding to a read operation, for example, relating to the embodiment of FIG. 13.

Referring to FIG. 15, in addition to the read operation shown in FIG. 7 and operations included therein, a voltage of the common source line CSL is shown in each operation. In one embodiment, the common source line CSL is floated in at least a partial period of the sensing operation included in the read operation. Accordingly, an increase in the average current or peak current flowing through the common source line CSL may be reduced or prevented. As a result, power consumption used for the read operation of the semiconductor memory device 100 may be reduced.

Figure 16:
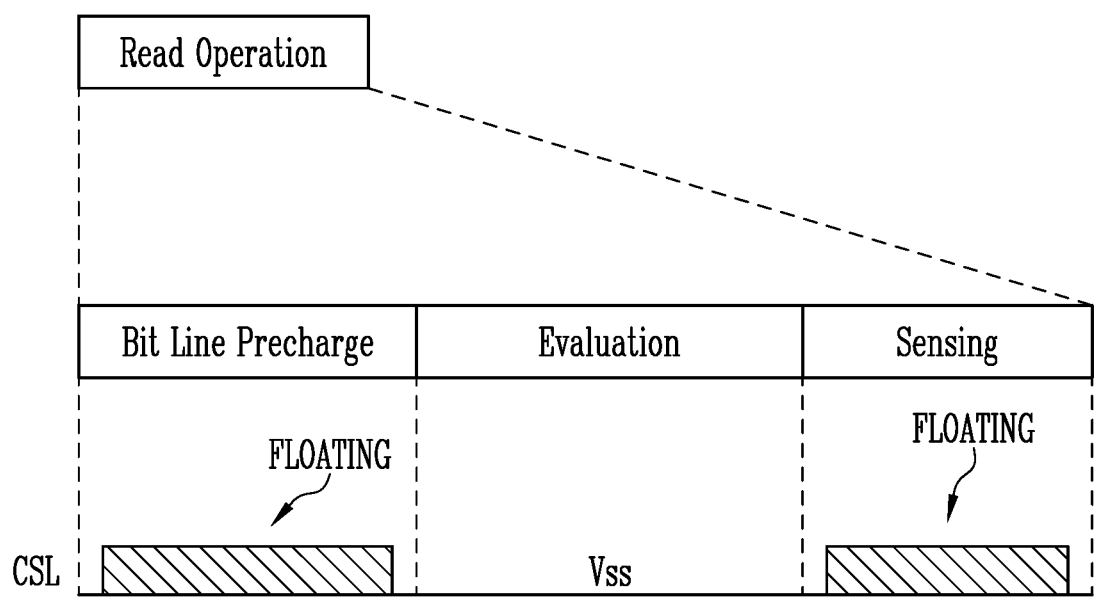
FIG. 16 illustrates an embodiment of a method of operating a semiconductor memory device.

FIG. 16 is a diagram schematically illustrating an embodiment relating to a read operation. In the embodiment of FIG. 12, the common source line CSL is floated only in at least a partial period of the bit line precharge operation in the read operation. In the embodiment of FIG. 15, the common source line CSL is floated only in at least a partial period of the sensing operation included in the read operation is shown. However, in one embodiment, the common source line CSL may be floated in at least a partial period of the bit line precharge operation included in the read operation and at least a partial period of the sensing operation as shown in FIG. 16.

Figure 17:
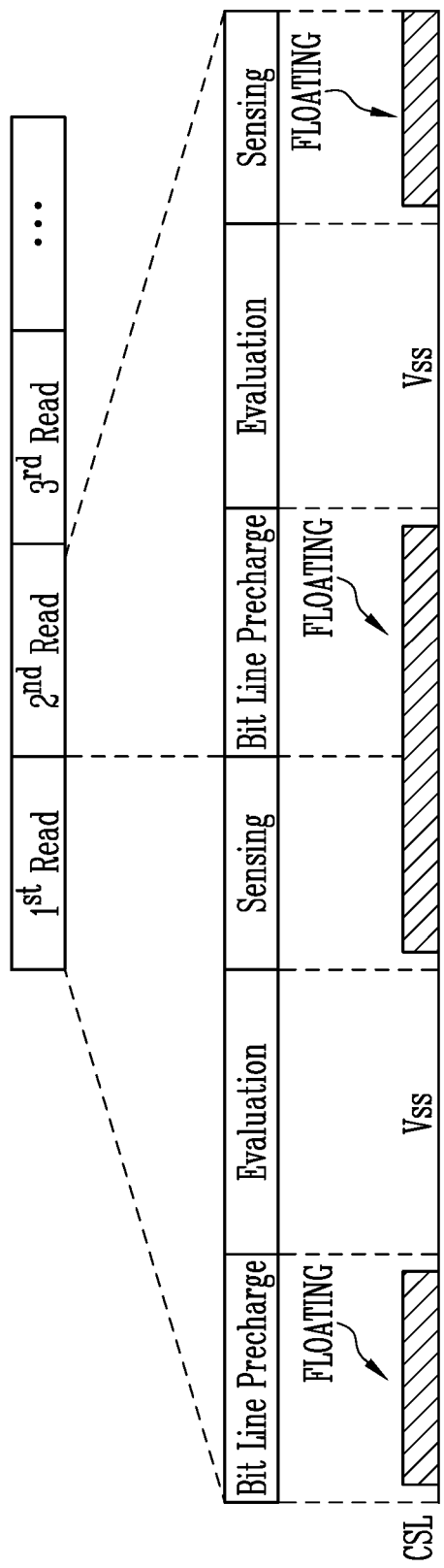
FIG. 17 illustrates an embodiment corresponding to a plurality of read operations.

FIG. 17 is a diagram schematically illustrating an embodiment corresponding to a plurality of read operations.

Referring to FIG. 17, a plurality of successively performed read operations are shown, e.g., a first read operation, a second read operation, a third read operation, and the like, may be successively performed. The plurality of read operations may be performed while changing read voltages for the same memory cells. For example, a read operation using a plurality of read voltages may be repeatedly performed to read data stored in a triple-level cell (TLC). However, in one embodiment, the plurality of read operations shown in FIG. 17 may be performed on different memory cells. For example, the first read operation may be performed on memory cells connected to the first word line WL1, the second read operation may be performed on memory cells connected to the second word line WL2, and the third read operation may be performed on the memory cells connected to the word line WL3.

FIG. 17 shows an embodiment which includes a bit line precharge operation, evaluation operation, and sensing operation in the first read operation, and a bit line precharge operation, evaluation operation, and sensing operation in the second read operation.

The common source line CSL may be floated during at least a partial period of the bit line precharge operation of the first read operation. The common source line CSL may be floated during the sensing operation of the first read operation and the bit line precharge operation of the second read operation. The common source line CSL may be floated in the sensing operation of the second read operation.

Thus, according to one embodiment, with respect to the plurality of successively performed read operations, the common source line may be floated during a sensing operation of a previous read operation and a bit line precharge operation of a current read operation. Accordingly, an increase in the average current or peak current flowing through the common source line CSL may be more effectively reduced or prevented. As a result, power consumption used for the read operation of the semiconductor memory device 100 may be drastically reduced.

Figure 18:
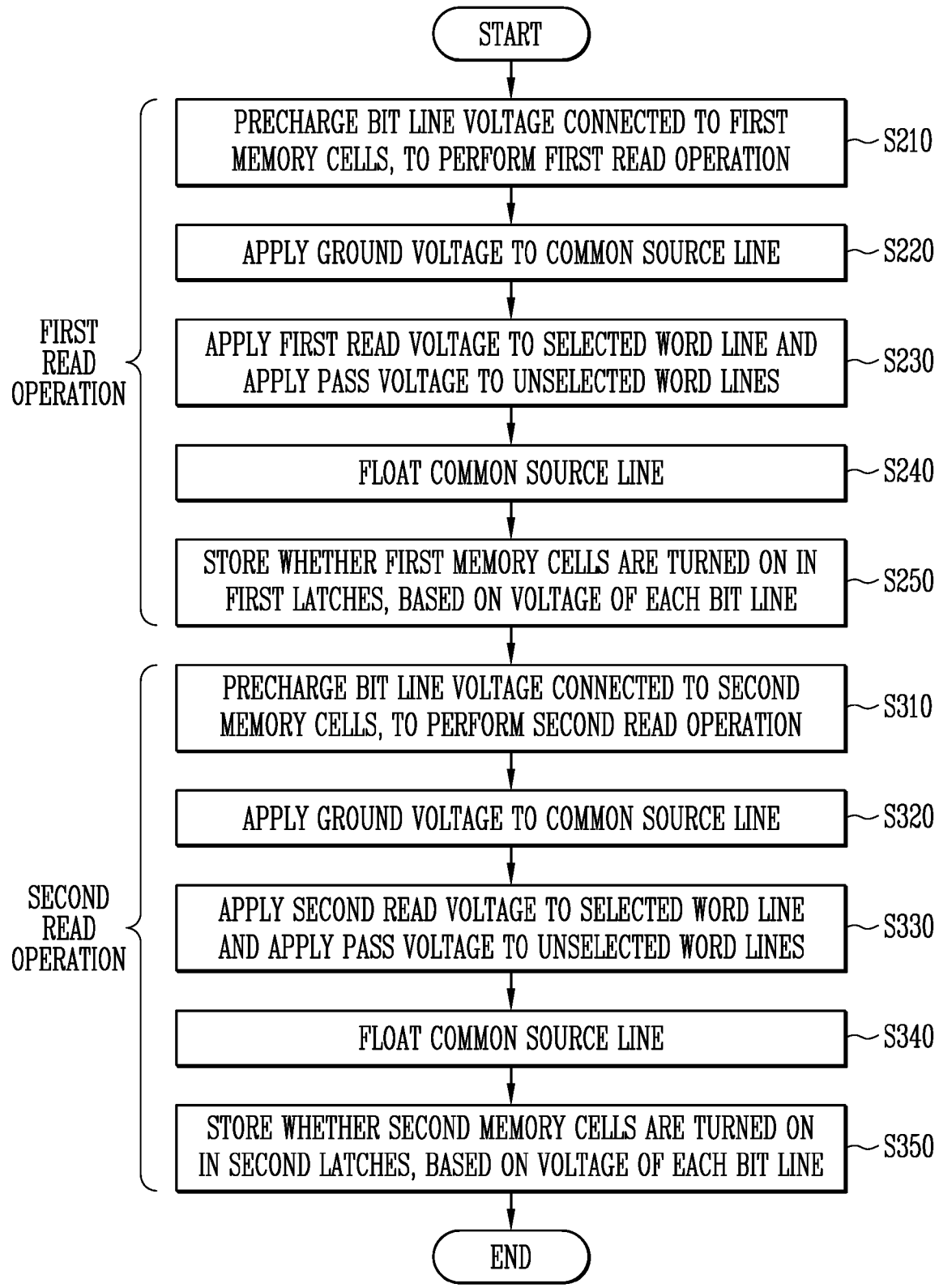
FIG. 18 illustrates a method of operating a semiconductor memory device.

FIG. 18 is a flowchart illustrating a method of operating a semiconductor memory device according to an embodiment.

Referring to FIG. 18, the method includes precharging a bit line voltage connected to first memory cells to perform a first read operation (S210), applying a reference (e.g., ground) voltage to a common source line (S220), applying a first read voltage to a selected first word line and applying a pass voltage to unselected word lines (S230), and floating the common source line (S240).

The method also includes storing information indicating whether the first memory cells are turned on in first latches based on a voltage of each bit line (S250), precharging a bit line voltage connected to second memory cells to perform a second read operation (S310), and applying the reference (e.g., ground) voltage to the common source line (S320).

The method also includes applying a second read voltage to the selected second word line and the pass voltage to the unselected word lines (S330), floating the common source line (S340), and storing information indicating whether the second memory cells are turned on in second latches based on the voltage of each bit line (S350). Operations S210 to S250 of FIG. 18 may be included in the first read operation, and operations S310 to S350 of FIG. 18 may be included in the second read operation.

In an embodiment, the first memory cells of operation S210 may be the second memory cells of operation S310. In this case, the first word line of operation S230 may be the second word line of operation S330. In this case, the first read voltage of operation S230 may be a voltage different from the second read voltage of operation S330.

In an embodiment, the first memory cells of operation S210 may be memory cells different from the second memory cells of operation S310. In this case, the first word line of operation S230 may be a word line different from the second word line of operation S330. In this case, the first read voltage of operation S230 may be identical to or different from the second read voltage of operation S330.

Operation S210 may correspond to the bit line precharge operation of the first read operation shown in FIG. 17. Operations S220 and S230 may correspond to the evaluation operation of the first read operation shown in FIG. 17. In addition, operations S240 and S250 may correspond to the sensing operation of the first read operation shown in FIG. 17.

Operation S310 may correspond to the bit line precharge operation of the second read operation shown in FIG. 17. Operations S320 and S330 may correspond to the evaluation operation of the second read operation shown in FIG. 17. In addition, operations S340 and S350 may correspond to the sensing operation of the second read operation shown in FIG. 17.

Referring to FIG. 18, the common source line CSL is floating in operation S240 of the first read operation, and the reference (e.g., ground) voltage Vss is applied to the common source line CSL in operation S320 of the second read operation. This corresponds to a configuration in which the common source line CSL is floated during the sensing operation of the first read operation and the bit line precharge operation of the second read operation in FIG. 17. Thus, according to one embodiment, with respect to the plurality of successively performed read operations, the common source line may be floated during the sensing operation of the previous read operation and the bit line precharge operation of the current read operation. Accordingly, an increase in the average current or peak current flowing through the common source line CSL may be more effectively reduced or prevented. As a result, power consumption used for the read operation of the semiconductor memory device 100 may be reduced to a greater degree.

Through FIGS. 7 to 18, embodiments applied to the read operation of the semiconductor memory device are described. However, other embodiments may be applied to the verify phase in the program operation, for example, as described with reference to FIGS. 19 to 21.

Figure 19:
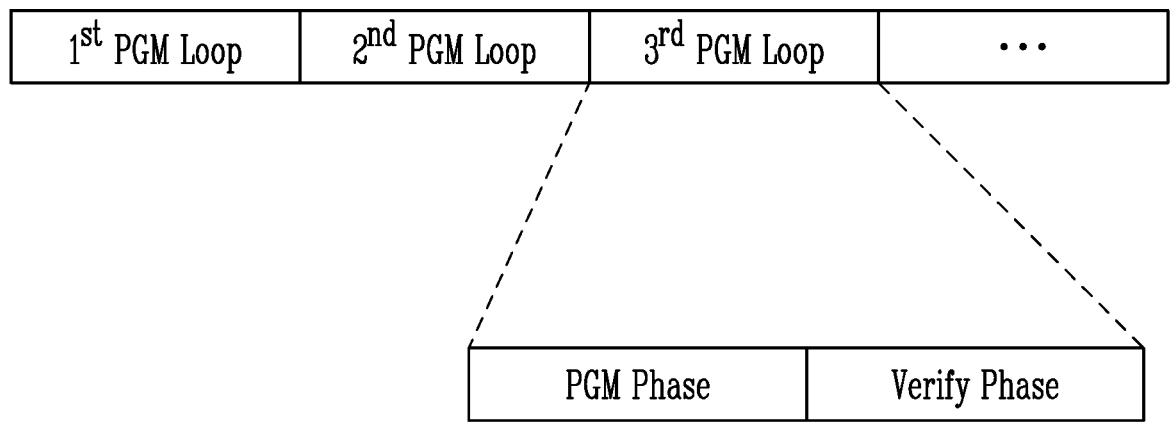
FIG. 19 is a diagram illustrating an embodiment of operations of a semiconductor memory device.

FIG. 19 is a diagram illustrating an embodiment of program loops included in a program operation and a program phase and a verify phase included in each program loop.

Referring to FIG. 19, the program operation may include the plurality of program loops. The program operation may be started by performing a first program loop $1^{st}$ PGM Loop. When the program operation is not completed (even though the first program loop $1^{st}$ PGM Loop is performed), a second program loop $2^{nd}$ PGM Loop may be performed. When the program operation is not completed (even though the second program loop $2^{nd}$ PGM Loop is performed), a third program loop $3^{rd}$ PGM Loop may be performed.

In such a method, program loops may be repeatedly performed until the program operation is completed. When the program operation is not completed even though the program loop is repeated up to a predetermined maximum number of program loops, it may be determined that the program operation has failed.

Each program loop may include a program phase PGM Phase and a verify phase Verify Phase. In the program phase, a program pulse is applied to the word line and thus a threshold voltage of memory cells in a program permission state increases. In the verify phase, it is determined whether the threshold voltage of each memory cell is greater than the verify voltage corresponding to a target program state. To this end, the verify voltage is applied to the word line, and it is sensed whether the threshold voltage of the selected memory cells is greater than the verify voltage. Such a verify phase may be similar to the read operation.

Figure 20:
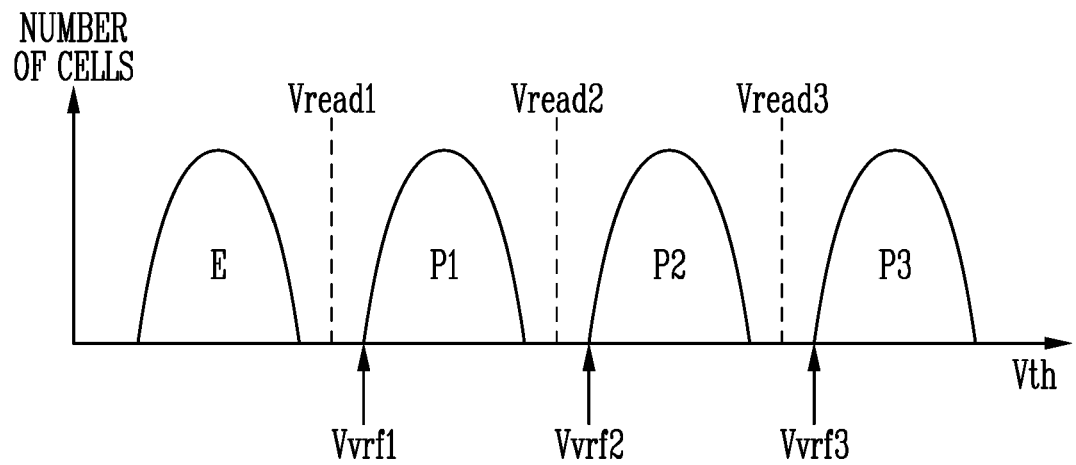
FIG. 20 illustrates an example of a multi-level cell threshold voltage distribution.

FIG. 20 is a graph illustrating an example of a threshold voltage distribution of a multi-level cell (MLC). This example of a threshold voltage distribution is for a multi-level cell storing two bits of data per memory cell. The multi-level cell has a threshold voltage corresponding to one of an erase state E, a first program state P1, a second program state P2, or a third program state P3. Therefore, in order to read data stored in the multi-level cell, a first read voltage Vread1, a second read voltage Vread2, and/or a third read voltage Vread3 may be used.

During the program operation, a first verify voltage Vvrf1 corresponding to the first program state P1, a second verify voltage Vvrf2 corresponding to the second program state P2, and a third verify voltage Vvrf3 corresponding to the third program state P3 may be used.

Figure 21:
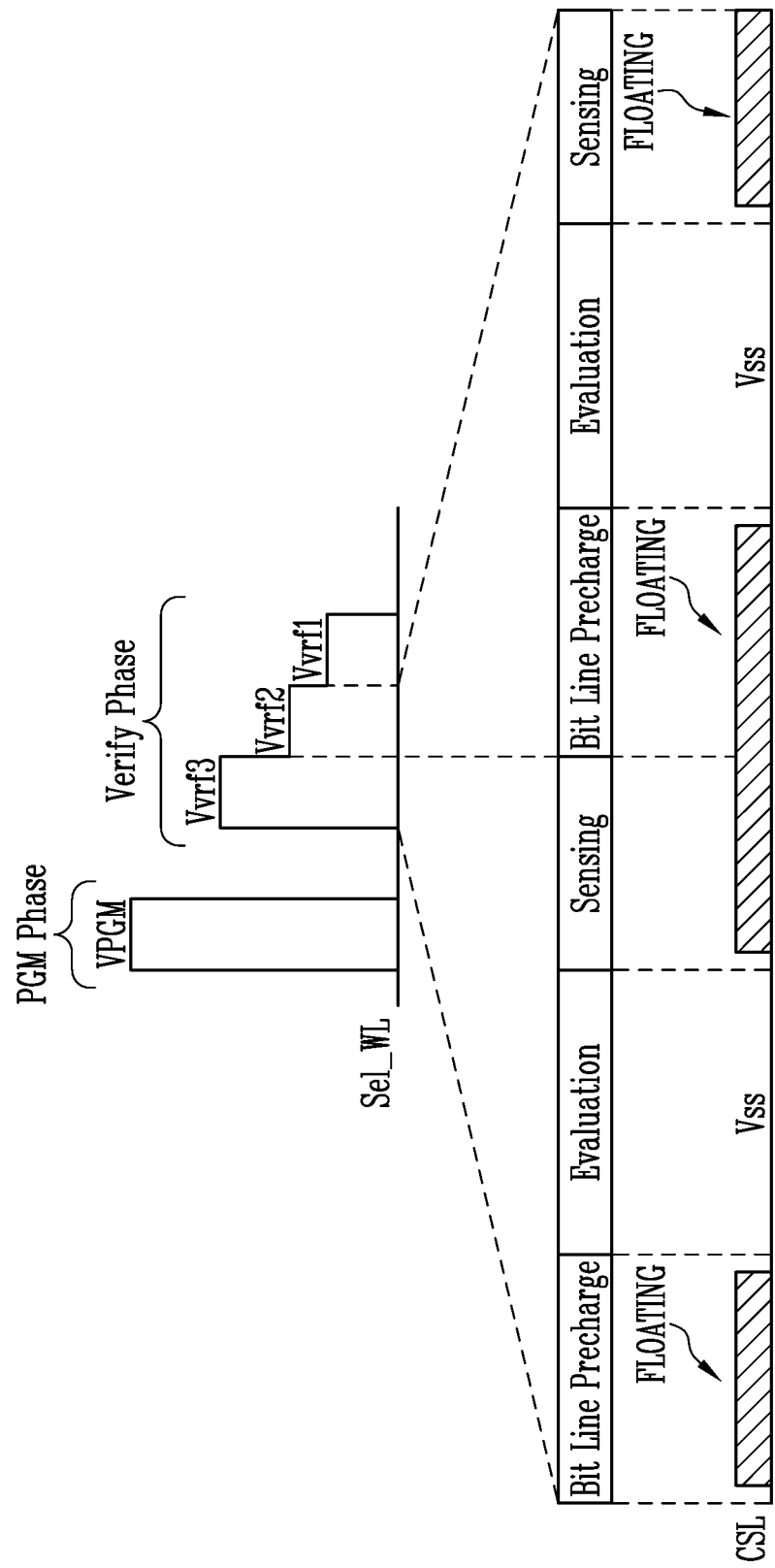
FIG. 21 illustrates an embodiment of a method of operating a semiconductor memory device.

FIG. 21 is a diagram schematically illustrating an embodiment performed in a verify phase. In FIG. 21, only one program loop (among the plurality of program loops included in the program operation) is shown as an example.

Referring to FIG. 21, the program loop includes the program phase PGM Phase and the verify phase Verify Phase. In the program phase PGM Phase, a program voltage VPGM is applied to the selected word line Sel_WL. A program pass voltage may be applied to the unselected word line in the program phase PGM Phase. Among the memory cells connected to the selected word line Sel_WL, in the program phase PGM Phase the threshold voltage of the memory cells in the program permission state may increase. The memory cell in the program permission state may correspond, for example, to a memory cell connected to a bit line to which a program permission voltage is applied among the memory cells connected to the selected word line Sel_WL.

In the program phase PGM Phase, a threshold voltage of memory cells in a program inhibition state among the memory cells connected to the selected word line Sel_WL may not increase. The memory cell in the program inhibition state may be one connected to a bit line to which a program inhibition voltage is applied, among the memory cells connected to the selected word line Sel_WL. In one embodiment, the program inhibition voltage may be a voltage higher than the program permission voltage.

In the verify phase Verify Phase after the program phase PGM Phase, a verify operation on memory cells to be programmed to each of the first to third program states P1 to P3 may be performed. In the embodiment shown in FIG. 21, it is first determined whether a threshold voltage of each of the memory cells to be programmed to the third program state P3 is greater than the third verify voltage Vvrf3. To this end, the third verify voltage Vvrf3 is applied to the selected word line.

Thereafter, it is determined whether a threshold voltage of each of the memory cells to be programmed to the second program state P2 is greater than the second verify voltage Vvrf2. To this end, the second verify voltage Vvrf2 is applied to the selected word line. Thereafter, it is determined whether a threshold voltage of each of the memory cells to be programmed to the first program state P1 is greater than the first verify voltage Vvrf1. To this end, the first verify voltage Vvrf1 is applied to the selected word line.

In one embodiment, referring to FIG. 21, in the verify phase, verification of the memory cells to be programmed to the third program state is performed first. Thereafter, verification of the memory cells to be programmed to the second program state is performed. Then, verification of the memory cells to be programmed to the first program state is performed. However, variations are possible. For example, verification of the memory cells to be programmed to the first program state may be performed first. Thereafter, verification of the memory cells to be programmed to the second program state may be performed. And then, verification of the memory cells to be programmed to the third program state may be performed.

In one embodiment, referring to FIG. 21, the program operation of the multi-level cell may include performing all verifications of memory cells to be programmed to the first to third program states in the verify phase. However, variations are possible. For example, in the verify phase Verify Phase, the verify operation may be performed only on one of the first to third program states P1 to P3. In another example, the verify operation may be performed on two selected program states among the first to third program states P1 to P3 in the Verify Phase.

Referring to FIG. 21, the verify operation on the memory cells to be programmed to the third program state may include a bit line precharge operation, an evaluation operation, and a sensing operation. The verify operation may include sensing a result (or information) indicating whether a threshold voltage of memory cells selected as a verify target is greater than or less than the verify voltage and storing the result in the latch component in the page buffer PBx.

The bit line precharge operation may include increasing a voltage of a bit line connected to the memory cells selected as the verify target to the precharge voltage. The evaluation operation may include evaluating the threshold voltage of each of the selected memory cells. For example, a bit line connected to memory cells having a threshold voltage higher than the verify voltage (e.g., an off-cell), among the selected memory cells, may maintain the precharge voltage during the evaluation operation. A voltage of a bit line connected to memory cells having a threshold voltage lower than the verify voltage (e.g., an on-cell), among the selected memory cells, may decrease during the evaluation operation. Therefore, a voltage of a corresponding bit line may be distinguished according to the threshold voltage of each memory cell. The sensing operation may include storing bit data (or information) indicating whether each of the selected memory cells is the on-cell or the off-cell, based on the voltage of the bit line distinguished as described above, in the latch component.

FIG. 21 shows the bit line precharge operation, the evaluation operation, and the sensing operation included in the verify operation corresponding to the third program state P3, among the verify operations corresponding to each of the third program state P3, the second program state P2, and the first program state P1. This embodiment also shows the bit line precharge operation, the evaluation operation, and the sensing operation included in the verify operation corresponding to the second program state P2. The verify operation corresponding to the first program state P1 also may include the bit line precharge operation, the evaluation operation, and the sensing operation.

The common source line CSL may be floated in at least a partial period of the bit line precharge operation of the verify operation corresponding to the third program state P3. In addition, the common source line CSL may be floated during the sensing operation of the verify operation corresponding to the third program state P3 and the bit line precharge operation of the verify operation corresponding to the second program state P2. The common source line CSL may be floated in the sensing operation of the verify operation corresponding to the second program state P2.

Thus, according to one embodiment involving a plurality of successively performed verify operations, the common source line may be floated during a sensing operation of a previous verify operation and a bit line precharge operation of a current verify operation. Accordingly, an increase in the average current or peak current flowing through the common source line CSL may be reduced or prevented to a greater decree. As a result, power consumption used for the verify operation of the semiconductor memory device 100 may be reduced.

Figure 22:
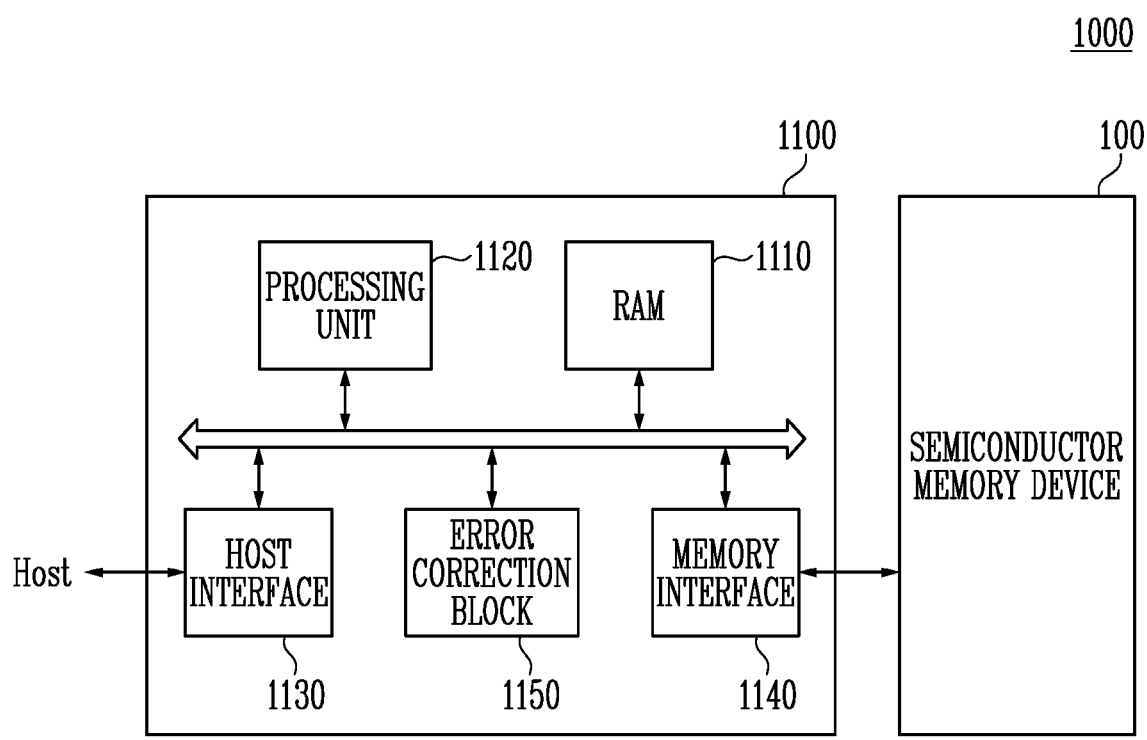
FIG. 22 illustrates an embodiment of a memory system.

FIG. 22 is a block diagram illustrating an embodiment of a memory system 1000 including the semiconductor memory device 100 of FIG. 1.

Referring to FIG. 22, the memory system 1000 includes the semiconductor memory device 100 and a memory controller 1100. The semiconductor memory device 100 may be the semiconductor memory device described with reference to FIG. 1 or any of the other embodiments described herein.

The memory controller 1100 is connected to a host Host and the semiconductor memory device 100. The memory controller 1100 is configured to access the semiconductor memory device 100 in response to a request from the host Host. For example, the memory controller 1100 is configured to control read, write, erase, and background operations of the semiconductor memory device 100. The memory controller 1100 is configured to provide an interface between the semiconductor memory device 100 and the host Host. The memory controller 1100 is configured to execute instructions (e.g., drive firmware) to control the semiconductor memory device 100.

The memory controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls an overall operation of the memory controller 1100. In addition, the memory controller 1100 may temporarily store program data provided from the host Host during the write operation.

The host interface 1130 operations based on a protocol for performing data exchange between the host Host and the memory controller 1100. As an exemplary embodiment, the memory controller 1100 is configured to communicate with the host Host through at least one of various interface protocols. Examples include a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1240 includes a NAND interface or a NOR interface.

The error correction block 1150 is configured to detect and correct an error of data received from the semiconductor memory device 100 using an error correcting code (ECC). As an exemplary embodiment, the error correction block may be provided as a component of the memory controller 1100.

The memory controller 1100 and the semiconductor memory device 100 may be integrated into one semiconductor device. As an exemplary embodiment, the memory controller 1100 and the semiconductor memory device 100 may be integrated into one semiconductor device to form a memory card. For example, the memory controller 1100 and the semiconductor memory device 100 may be integrated into one semiconductor device to form a memory card. Examples include a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The memory controller 1100 and the semiconductor memory device 100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host connected to the memory system 1000 is dramatically improved.

In one example, the memory system 1000 is provided as one of various components of an electronic device. Examples of the electronic device include a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an exemplary embodiment, the semiconductor memory device 100 or the memory system 1000 may be mounted as a package of various types. For example, the semiconductor memory device 100 or the memory system 1000 may be packaged and mounted in a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 23:
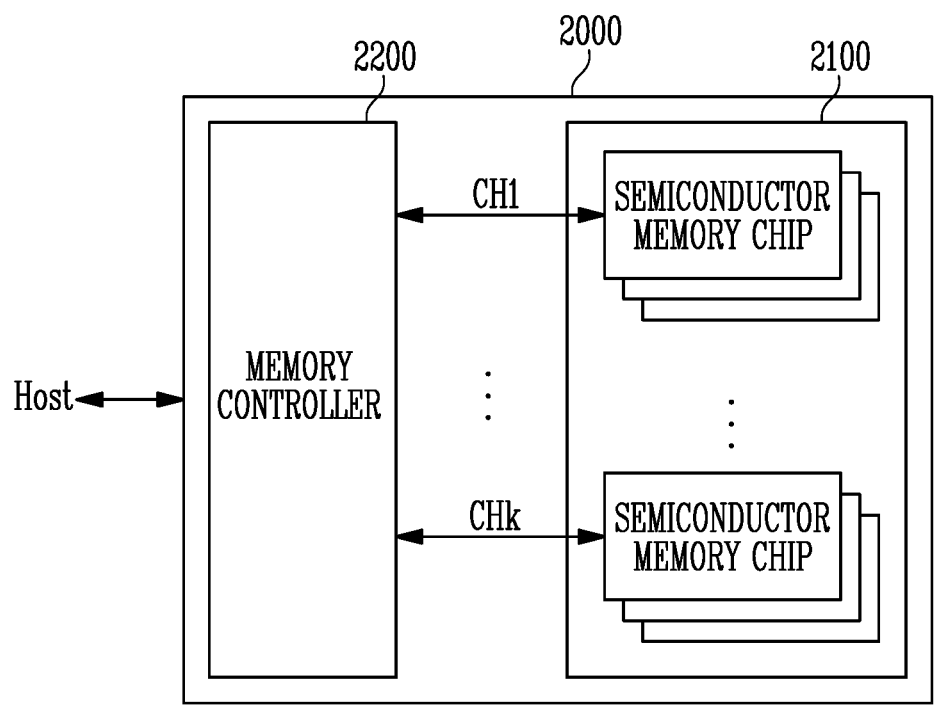
FIG. 23 illustrates an application example of a memory system.

FIG. 23 is a block diagram illustrating an application example of the memory system of FIG. 22.

Referring to FIG. 23, the memory system 2000 includes a semiconductor memory device 2100 and a memory controller 2200. The semiconductor memory device 2100 includes a plurality of semiconductor memory chips divided into a plurality of groups.

The plurality of groups may communicate with the memory controller 2200 through first to k-th channels CH1 to CHk, respectively. Each semiconductor memory chip is configured and is operated similarly to that of the semiconductor memory device 100 described with reference to FIG. 1.

Each group is configured to communicate with the memory controller 2200 through one common channel. The memory controller 2200 is configured similarly to the memory controller 1100 described with reference to FIG. 22 and is configured to control the plurality of memory chips of the semiconductor memory device 2100 through the plurality of channels CH1 to CHk.

Figure 24:
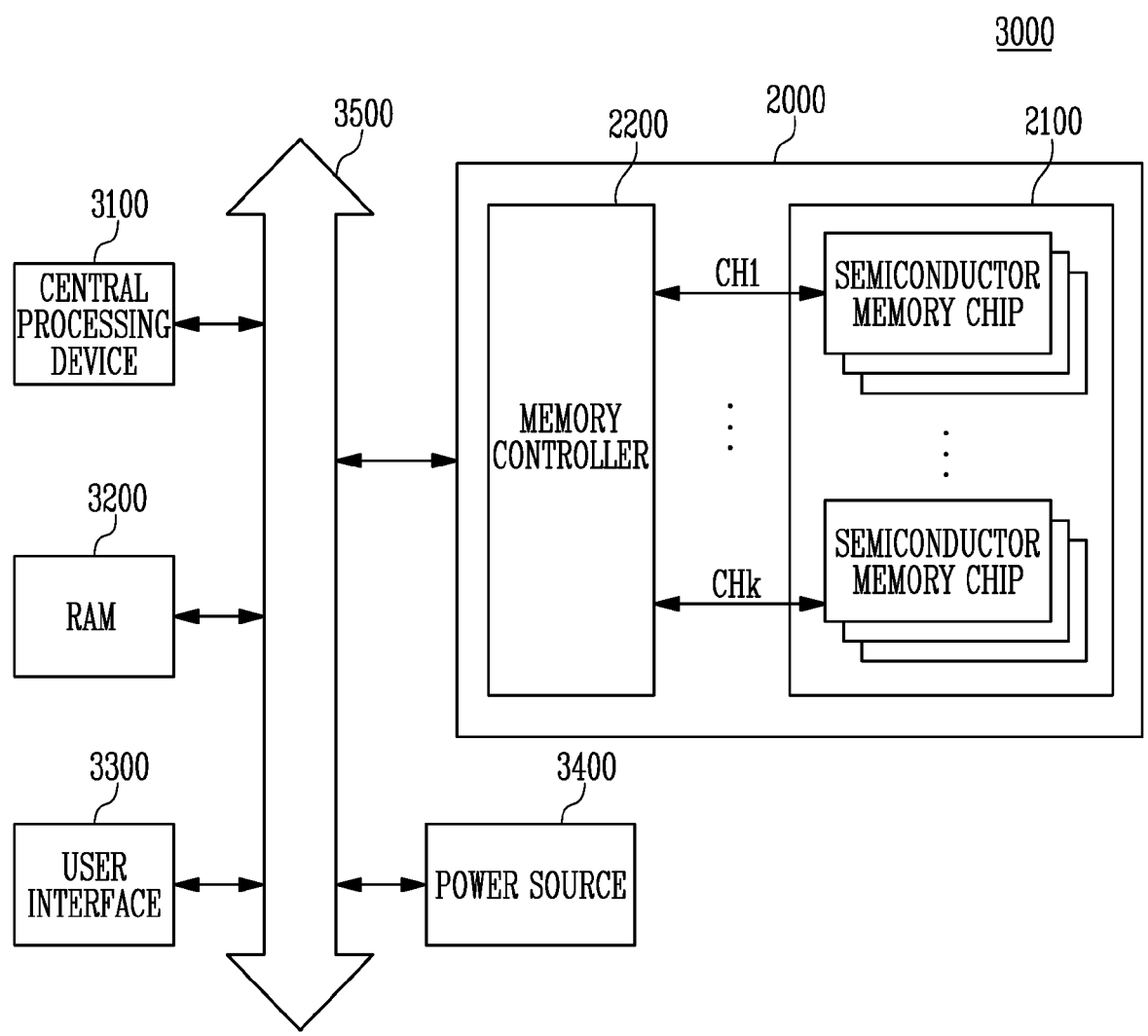
FIG. 24 illustrates an embodiment of a computing system.

FIG. 24 is a block diagram illustrating an embodiment of a computing system 3000 including a memory system, for example, as described with reference to FIG. 23.

The computing system 3000 includes a central processing device 3100, a random access memory (RAM) 3200, a user interface 3300, a power source 3400, a system bus 3500, and the memory system 2000. The memory system 2000 is electrically connected to the central processing device 3100, the RAM 3200, the user interface 3300, and the power source 3400 through the system bus 3500. Data provided through the user interface 3300 or processed by the central processing device 3100 is stored in the memory system 2000.

The semiconductor memory device 2100 is connected to the system bus 3500 through the memory controller 2200. However, the semiconductor memory device 2100 may be configured to be directly connected to the system bus 3500. At this time, a function of the memory controller 2200 is performed by the central processing device 3100 and the RAM 3200.

The memory system 2000 described with reference to FIG. 23 is provided. However, the memory system 2000 may be replaced with the memory system 1000 described with reference to FIG. 22. As an exemplary embodiment, the computing system 3000 may be configured to include both of the memory systems 1000 and 2000 described with reference to FIGS. 22 and 23.

In accordance with one embodiment, an apparatus includes a storage area configured to store instructions and at least one processor. The storage area may be coupled to or included in any embodiments of the control logic, processors, or controllers described herein, or may be included in any of the memories described herein. The at least one processor may correspond, in whole or part, to the control logic, processors, and/or controllers described herein.

In operation, the at least one processor executes the instructions to perform the operations of the embodiments described herein. For example, the at least one processor may execute the instructions to control a read operation including a bit line precharge operation, an evaluation operation, and a sensing operation. The at least one processor may control the read operation to float a common source line connected to a memory block during at least a partial period. The partial period may be included in a period of the bit line precharge operation in which a voltage of a plurality of bit lines connected to the memory block increases.

The methods, processes, and/or operations described herein may be performed by code or instructions to be executed by a computer, processor, controller, or other signal processing device. The computer, processor, controller, or other signal processing device may be those described herein or one in addition to the elements herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented in at least partially in software, the controllers, processors, devices, managers, components, modules, units, multiplexers, generators, blocks, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope herein.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

What is claimed is:

1. A semiconductor memory device, comprising:
   a memory block including a plurality of memory cells; and
   a control logic configured to control a peripheral circuit to perform a read operation on selected memory cells among the plurality of memory cells,
   wherein the read operation includes a bit line precharge operation increasing a voltage of a plurality of bit lines to a predetermined precharge voltage, an evaluation operation, and a sensing operation, and wherein the control logic is configured to:
   control the peripheral circuit to float a common source line coupled to the memory block during at least a partial period of a period in which the voltage of the plurality of bit lines increases.

2. The semiconductor memory device of claim 1, wherein, in the bit line precharge operation, the control logic is configured to control the peripheral circuit to:

apply a turn-off voltage to a drain select line and a source select line coupled to the memory block.

3. The semiconductor memory device of claim 1, wherein, in the evaluation operation, the control logic is configured to control the peripheral circuit to:
apply a read voltage to a selected word line coupled to the selected memory cells,
apply a pass voltage to an unselected word line, and
apply a turn-on voltage to a drain select line and a source select line coupled to the memory block.

4. The semiconductor memory device of claim 3, wherein the control logic is configured to control the peripheral circuit to apply a reference voltage to the common source line in the evaluation operation.

5. The semiconductor memory device of claim 3, wherein, in the sensing operation, the control logic is configured to control the peripheral circuit to temporarily store information indicating whether the selected memory cells are turned on.

6. The semiconductor memory device of claim 5, wherein the control logic is configured to control the peripheral circuit to float the common source line during at least a partial period of the sensing operation.

7. A semiconductor memory device, comprising:
a memory block including a plurality of memory cells; and
a control logic configured to control a peripheral circuit to perform a plurality of read operations on selected memory cells among the plurality of memory cells,
wherein each of the plurality of read operations includes a bit line precharge operation increasing a voltage of a plurality of bit lines to a predetermined precharge voltage, an evaluation operation, and a sensing operation, wherein
the control logic is configured to control the peripheral circuit to float a common source line coupled to the memory block during at least a partial period of a period in which the voltage of the plurality of bit lines increases, and
wherein the period includes the sensing operation of a first read operation and the bit line precharge operation of a second read operation following the first read operation.

8. The semiconductor memory device of claim 7, wherein, in the sensing operation of the first read operation, the control logic is configured to control the peripheral circuit to temporarily store information indicating whether memory cells selected as a target of the first read operation are turned on.

9. The semiconductor memory device of claim 7, wherein, in the bit line precharge operation of the second read operation, the control logic is configured to control the peripheral circuit to:
apply a turn-off voltage to a drain select line and a source select line coupled to the memory block.

10. The semiconductor memory device of claim 7, wherein, in the evaluation operation of the first read operation, the control logic is configured to control the peripheral circuit to:
apply a read voltage to a first selected word line coupled to first memory cells selected as a target of the first read operation,
apply a pass voltage to an unselected word line other than the first selected word line,
apply a turn-on voltage to a drain select line and a source select line coupled to the memory block, and
apply a reference voltage to the common source line.

11. The semiconductor memory device of claim 10, wherein, in the evaluation operation of the second read operation, the control logic is configured to control the peripheral circuit to:
apply the read voltage to a second selected word line coupled to second memory cells selected as a target of the second read operation,
apply the pass voltage to an unselected word line other than the second selected word line,
apply the turn-on voltage to the drain select line and the source select line coupled to the memory block, and
apply the reference voltage to the common source line.

12. A method of operating a semiconductor memory device, the method comprising:
performing a read operation on selected memory cells among a plurality of memory cells, the read operation including:
precharging a voltage of bit lines coupled to a memory block including the selected memory cells;
applying a read voltage to a selected word line coupled to the selected memory cells among word lines coupled to the memory block, and applying a read pass voltage to an unselected word line other than the selected word line among the word lines; and
temporarily storing information indicating whether the selected memory cells are turned on, based on the voltage of each of the bit lines, wherein precharging the voltage of the bit lines coupled to the memory block including the selected memory cells comprises floating a common source line coupled to the memory block during at least a partial period of a period in which the voltage of the bit lines increases.

13. The method of claim 12, wherein precharging the voltage of the bit lines coupled to the memory block including the selected memory cells comprises:
increasing the voltage of the bit lines to a predetermined precharge voltage, and
applying a turn-off voltage to a drain select line and a source select line coupled to the memory block.

14. The method of claim 12, wherein applying the read voltage to the selected word line coupled to the selected memory cells among the word lines coupled to the memory block and applying the read pass voltage to the unselected word line other than the selected word line among the word lines comprises:
applying the read voltage to the selected word line coupled to the selected memory cells,
applying a pass voltage to the unselected word line, and
applying a turn-on voltage to a drain select line and a source select line coupled to the memory block.

15. The method of claim 14, wherein applying the read voltage to the selected word line coupled to the selected memory cells among the word lines coupled to the memory block, and applying the read pass voltage to the unselected word line other than the selected word line among the word lines comprises applying a reference voltage to the common source line.

16. The method of claim 12, wherein temporarily storing the information indicating whether the selected memory cells are turned on, based on the voltage of each of the bit lines comprises floating the common source line.

17. A semiconductor memory device, comprising:
a memory block including a plurality of memory cells;
a peripheral circuit configured to perform a program operation on selected memory cells among the plurality of memory cells; and a control logic configured to control the program operation of the peripheral circuit, wherein the program operation includes a plurality of program loops, each of the plurality of program loops includes a program phase and a verify phase, the verify phase includes a bit line precharge operation, an evaluation operation, and a sensing operation, and the control logic is configured to control the peripheral circuit to float a common source line coupled to the memory block during at least a partial period of a period of the bit line precharge operation, in which a voltage of a plurality of bit lines coupled to the memory block increases.

18. The semiconductor memory device of claim 17, wherein, in the bit line precharge operation, the control logic is configured to control the peripheral circuit to:

increase the voltage of the plurality of bit lines to a predetermined precharge voltage, and apply a turn-off voltage to a drain select line and a source select line coupled to the memory block.

19. The semiconductor memory device of claim 17, wherein, in the evaluation operation, the control logic is configured to control the peripheral circuit to:

apply a verify voltage to a selected word line coupled to the selected memory cells, apply a pass voltage to an unselected word line, apply a turn-on voltage to a drain select line and a source select line coupled to the memory block, and apply a reference voltage to the common source line.

20. The semiconductor memory device of claim 19, wherein, in the sensing operation, the control logic is configured to control the peripheral circuit to temporarily store information indicating whether the selected memory cells are turned on and float the common source line during at least a partial period of the sensing operation.

21. An apparatus, comprising:

a storage area configured to store instructions; and at least one processor configured to execute the instructions to control a read operation including a bit line precharge operation increasing a voltage of a plurality of bit lines to a predetermined precharge voltage, an evaluation operation, and a sensing operation, wherein the at least one processor is configured to control the read operation to:

float a common source line coupled to a memory block during at least a partial period of a period in which the voltage of the plurality of bit lines increases.

* * * * *